United States Patent
Payne et al.

(10) Patent No.: US 10,360,776 B2
(45) Date of Patent: Jul. 23, 2019

(54) POWER AND/OR ALARMING SECURITY SYSTEM FOR ELECTRICAL APPLIANCES

(71) Applicant: Mobile Tech, Inc., Lake Oswego, OR (US)

(72) Inventors: Steven R. Payne, Hillsboro, OR (US); Kenneth A. Boehlke, Portland, OR (US); Kimberly Porter Miyake, Portland, OR (US); Wade Carter Wheeler, Portland, OR (US)

(73) Assignee: MOBILE TECH, INC., Lake Oswego, OR (US)

( * ) Notice: Subject to any disclaimer, the term of this patent is extended or adjusted under 35 U.S.C. 154(b) by 0 days.

(21) Appl. No.: 16/117,304

(22) Filed: Aug. 30, 2018

(65) Prior Publication Data
US 2019/0073884 A1  Mar. 7, 2019

Related U.S. Application Data

(60) Provisional application No. 62/651,598, filed on Apr. 2, 2018, provisional application No. 62/553,770, filed on Sep. 1, 2017.

(51) Int. Cl.
*G01R 1/20* (2006.01)
*G08B 13/22* (2006.01)
(Continued)

(52) U.S. Cl.
CPC .............. *G08B 13/22* (2013.01); *G01R 1/20* (2013.01); *G01R 19/16528* (2013.01);
(Continued)

(58) Field of Classification Search
CPC ...... G08B 13/22; G01R 1/20; H01R 13/6683; H01R 13/6691; H01R 13/7175
(Continued)

(56) References Cited

U.S. PATENT DOCUMENTS 3,974,492 A * 8/1976 Girismen ........... G08B 13/1409
   340/635
4,059,843 A * 11/1977 Girismen ........... G08B 13/1409
   307/326
(Continued)

FOREIGN PATENT DOCUMENTS

EP    0218281 B1   4/1987
WO  2010020809 A2  2/2010
(Continued)

OTHER PUBLICATIONS

International Search Report and Written Opinion for International patent application No. PCT/EP2014/059457, dated Feb. 2, 2015.
(Continued)

*Primary Examiner* — John A Tweel, Jr.
(74) *Attorney, Agent, or Firm* — Thompson Coburn LLP

(57) ABSTRACT

The present disclosure relates generally to security systems and, more particularly, to a power and/or alarming security system for electrical appliances. In an example embodiment, an apparatus comprises a socket and a circuit. The socket can be configured for detachable electrical connection with an electrical appliance. The circuit can be configured to (1) provide power to a connected electrical appliance through the socket, and (2) calibrate an alarm limit for a security function for the socket based on a plurality of electrical characteristics of the connected electrical appliance that are measured via the socket, wherein the electrical characteristics comprise an admittance characteristic and a current draw characteristic of the connected electrical appliance. Furthermore, the circuit can calibrate the alarm limit for the socket according to a plurality of calibration phases.

30 Claims, 20 Drawing Sheets

(51) Int. Cl.
  *G01R 19/165* (2006.01)
  *G08B 7/06* (2006.01)
  *H01R 25/00* (2006.01)
  *H01R 13/66* (2006.01)
  *H01R 13/717* (2006.01)

(52) U.S. Cl.
  CPC ............ *G08B 7/06* (2013.01); *H01R 25/003* (2013.01); *H01R 13/6683* (2013.01); *H01R 13/6691* (2013.01); *H01R 13/7175* (2013.01)

(58) Field of Classification Search
  USPC ....................................................... 340/664
  See application file for complete search history.

(56) References Cited

U.S. PATENT DOCUMENTS

| | | | |
|---|---|---|---|
| 5,021,940 | A | 6/1991 | Cox et al. |
| 5,525,965 | A | 6/1996 | Liebenthal |
| 6,148,258 | A | 11/2000 | Boisvert et al. |
| 6,150,940 | A * | 11/2000 | Chapman ............... G08B 13/14 200/61.59 |
| 6,836,214 | B2 * | 12/2004 | Choi ................. G08B 13/1409 340/568.1 |
| 8,165,832 | B1 | 4/2012 | Low et al. |
| 8,221,154 | B1 | 7/2012 | Paquette |
| 8,250,342 | B1 | 8/2012 | Kostamov et al. |
| 8,461,725 | B1 | 6/2013 | Stubbs et al. |
| 9,318,857 | B2 | 4/2016 | Soneda et al. |
| 9,892,604 | B2 | 2/2018 | Blaser et al. |
| 9,923,344 | B2 * | 3/2018 | Batista Oliveira Costa Leal ........ H02G 9/02 |
| 9,978,232 | B2 | 5/2018 | Weusten et al. |
| 2007/0263852 | A1 | 11/2007 | Schley-May et al. |
| 2008/0053847 | A1 | 3/2008 | Rakosky et al. |
| 2008/0130340 | A1 | 6/2008 | Unger et al. |
| 2011/0062792 | A1 | 3/2011 | Okazaki |
| 2011/0298301 | A1 | 12/2011 | Wong et al. |
| 2012/0043813 | A1 | 2/2012 | Doi et al. |
| 2012/0045939 | A1 | 2/2012 | Pocrass |
| 2012/0185185 | A1 | 7/2012 | Bae et al. |
| 2013/0196530 | A1 * | 8/2013 | Cheatham .......... H01R 13/6275 439/357 |
| 2013/0265164 | A1 | 10/2013 | Brown et al. |
| 2014/0115367 | A1 | 4/2014 | Soda |
| 2014/0292304 | A1 | 10/2014 | Dilly et al. |
| 2017/0116832 | A1 | 4/2017 | Weusten et al. |
| 2017/0164314 | A1 | 6/2017 | Wylie et al. |
| 2017/0300721 | A1 | 10/2017 | Blaser et al. |
| 2018/0288720 | A1 | 10/2018 | Blaser et al. |
| 2018/0288721 | A1 | 10/2018 | Blaser et al. |
| 2018/0288722 | A1 | 10/2018 | Blaser et al. |

FOREIGN PATENT DOCUMENTS

| | | |
|---|---|---|
| WO | 2011133578 A1 | 10/2011 |
| WO | 2012110825 A2 | 8/2012 |
| WO | 2015169373 A1 | 11/2015 |
| WO | 2016192800 A1 | 12/2016 |

OTHER PUBLICATIONS

Prosecution History of U.S. Appl. No. 15/346381, now U.S. Pat. No. 9,978,232, filed Nov. 8, 2016.

International Search Report and Written Opinion for International patent application No. PCT/US2018/048865, dated Jan. 8, 2019.

* cited by examiner

POWER AND/OR ALARMING SECURITY SYSTEM FOR ELECTRICAL APPLIANCES

CROSS-REFERENCE AND PRIORITY CLAIM TO RELATED APPLICATIONS

This patent application claims priority to U.S. provisional patent application 62/651,598, filed Apr. 2, 2018, and entitled "Power and/or Alarming Security System for Electrical Appliances", the entire disclosure of which is incorporated herein by reference.

This patent application also claims priority to U.S. provisional patent application 62/553,770, filed Sep. 1, 2017, and entitled "Power and/or Alarming Security System for Electrical Appliances", the entire disclosure of which is incorporated herein by reference.

INTRODUCTION

In many environments, such as retail store environments, it is desirable to reduce the risk of theft with respect to electrical appliances. For example, in many retail stores, electrical appliances are on display to customers in a manner that allows a customer to hold and operate such appliances as this can help customers make purchase decisions about the electrical appliances. However, many conventional loss prevention systems in the art for electrical appliances can be obstructive with respect to the degree of customer interactions that are permitted with the displayed electrical appliances. To provide loss prevention security while still permitting a high degree of customer interaction, the inventors disclose how security functions for the electrical appliances can be integrated into a power strip for the electrical appliance. Such a "smart" or "intelligent" power strip can be designed to not only provide power to a connected electrical appliance but also trigger an alarm if the electrical appliance is disconnected from the power strip. Such an intelligent power strip can include one or more sockets through which an electrical appliance is connected. The power strip can monitor electrical characteristics of the connected electrical appliance through the socket and make decisions based on these monitored electrical characteristics as to whether an alarm should be triggered.

However, there are a variety of technical challenges with respect to how to design such a power strip so that the risk of false alarms is reduced while still providing adequate security. For example, it is desirable to allow customers to operate a connected electrical appliance so that the customer can make a purchase decision. Such operation may cause wide variances in the electrical characteristics of the connected electrical appliance (e.g., the current drawn through the socket may vary based on the nature of use and whether the electrical appliance has been turned on or off by a user). As an example, if the connected electrical appliance is a lamp, it is desirable for the power strip to not trigger an alarm in response to a customer action of turning the lamp on and off instead, the alarm should be triggered in response to a person disconnecting the lamp from the power strip. The inventors disclose a variety of solutions for distinguishing between such actions through the monitored electrical characteristics.

Furthermore, different electrical appliances can have vastly different electrical characteristics when connected to a power strip (e.g., lamps versus TVs versus vacuum cleaners, etc.). Further still, it is desirable for the power strip to provide security functions for not only electrical appliances that receive and operate from AC power but also for electrical appliances that receive and operate from DC power. There are additional technical challenges in designing an intelligent power strip that is able to accommodate and work with such a wide array of different types of electrical appliances, and the inventors disclose a variety of solutions to this problem as well.

These and other features and advantages of the present invention will be described hereinafter to those having ordinary skill in the art.

Reference is made in the following detailed description to accompanying drawings, which form a part hereof, wherein like numerals may designate like parts throughout that are corresponding and/or analogous. It will be appreciated that the figures have not necessarily been drawn to scale, such as for simplicity and/or clarity of illustration. For example, dimensions of some aspects may be exaggerated relative to others. Further, it is to be understood that other embodiments may be utilized.

DETAILED DESCRIPTION OF EXAMPLE EMBODIMENTS

References throughout this specification to one implementation, an implementation, one embodiment, an embodiment and/or the like means that a particular feature, structure, and/or characteristic described in connection with a particular implementation and/or embodiment is included in at least one implementation and/or embodiment of the disclosure. Thus, appearances of such phrases, for example, in various places throughout this specification are not necessarily intended to refer to the same implementation or to any one particular implementation described. Furthermore, it is to be understood that particular features, structures, and/or characteristics described are capable of being combined in various ways in one or more implementations and, therefore, are within intended claim scope. In general, these and other issues vary with context. Therefore, particular context of description and/or usage provides helpful guidance regarding inferences to be drawn.

Figure 1A:
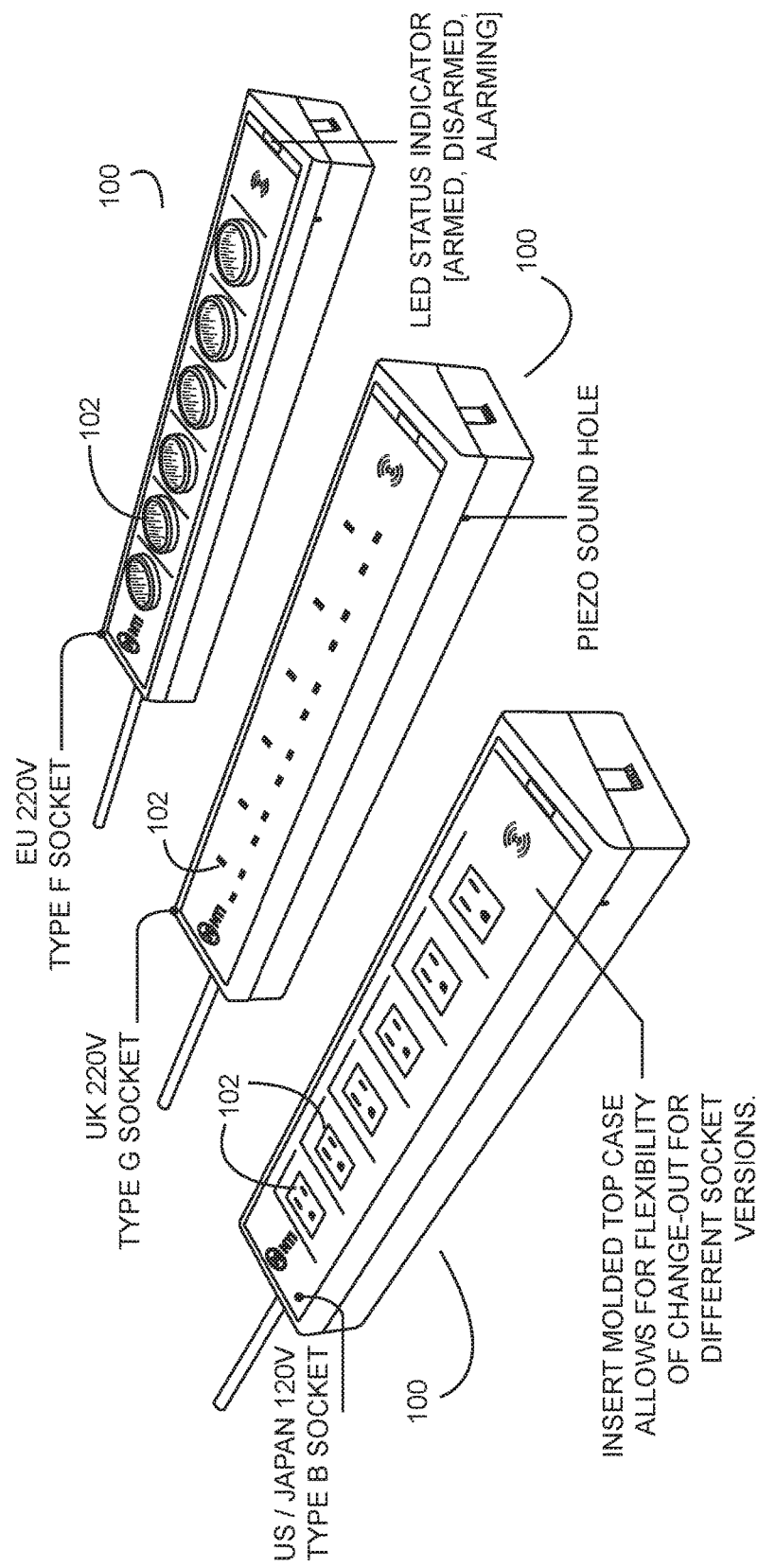
FIG. 1A shows an example embodiment of various intelligent power strips that include a security function as described herein.
Figure 1B:
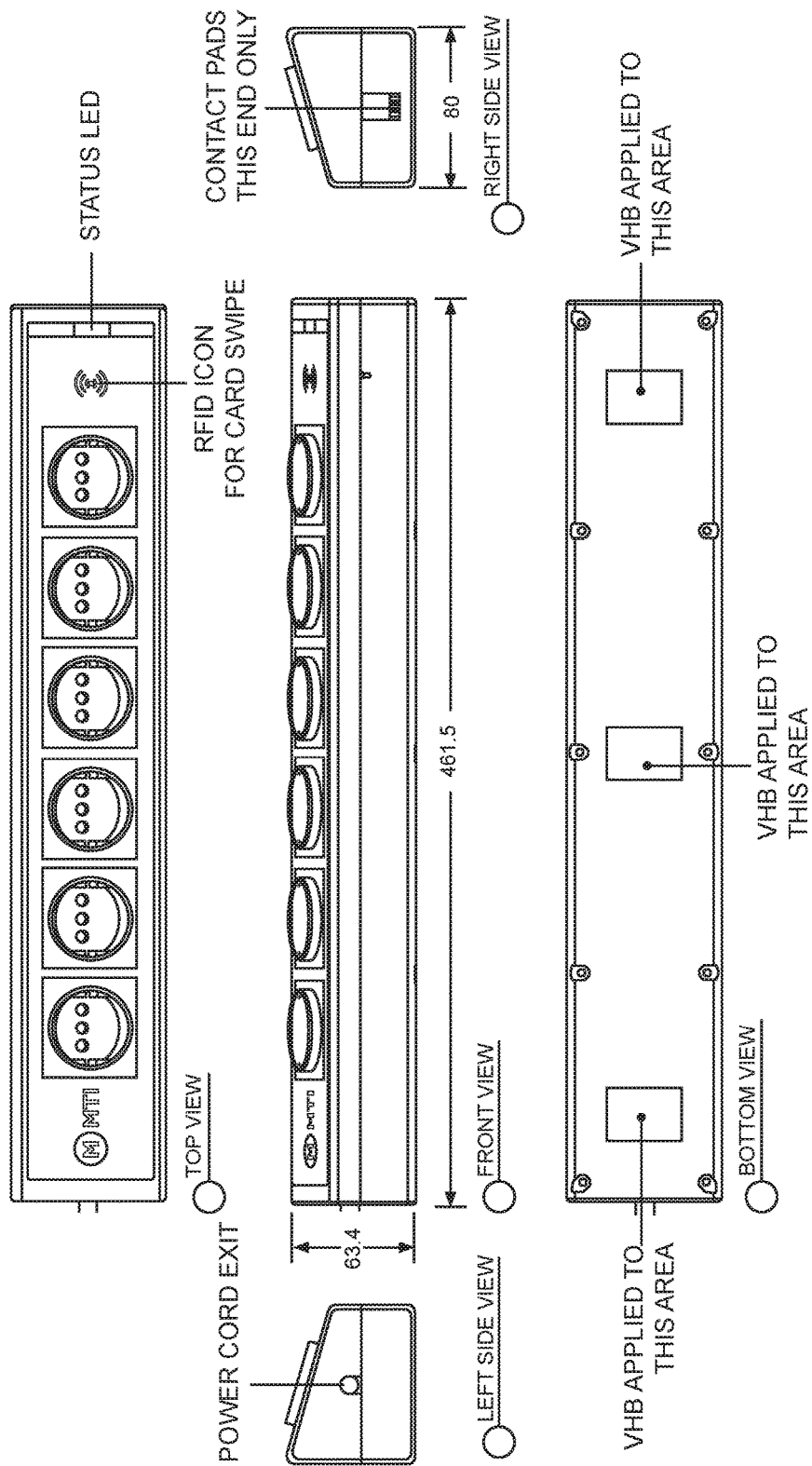
FIG. 1B shows top, side, and bottom views of an example power strip.

As will be described in greater detail below, in an implementation, a power and/or alarming security system (e.g., a power strip, etc.) for electrical appliances may be utilized to facilitate and/or support loss prevention that may provide power to and/or secure multiple electrical appliances. FIG. 1A shows example embodiments of intelligent power strips 100 that provide a security function for connected electrical appliances. Any of a wide variety of electrical appliances can be connected to the power strip 100 in example embodiments. For example, electrical appliances that operate from AC power may be used (e.g., vacuum cleaners, televisions, lamps, etc.). As another example, electrical appliances that operate from DC power may also be used (e.g., laptop computers, tablet computers, smart phones, etc.). For ease of reference, the terms "electrical appliance" and "electrical device" or "device" will be used interchangeably in the context of items connected to a system socket. In a retail store context, such appliances/devices can also be referred to as SKUs. However, it should be understood that the devices secured by example embodiments described herein need not necessarily be items for retail merchandising. But, at the same time, it should be understood that the power strips 100 can be used to provide power and security for a plurality of electrical appliances that are merchandised to customers in a store. In the example of FIG. 1A, each power strip 100 includes 6 sockets 102 into which electrical appliances can be plugged to form an electrical connection between circuitry in the power strip 100 and the electrical appliance. While the example of FIG. 1A shows each power strip including 6 sockets 102, it should be understood that the power strip 100 may comprise more or fewer sockets 102 if desired by a practitioner. Accordingly, the power strip 100 may comprise one or more sockets 102 depending upon the desires of a practitioner. FIG. 1A also shows that the socket configurations (e.g., plug/pin layout) may vary by geographic region to comply with socket standardization in those regions. As such, the sockets 102 may vary in terms of the shape and plug/pin configurations by regions as indicated by FIG. 1A. Further still, the nature of the power signal itself may also vary by region. FIG. 1B shows top, bottom, and side views of an example power strip 100 from FIG. 1A.

Figure 1C:
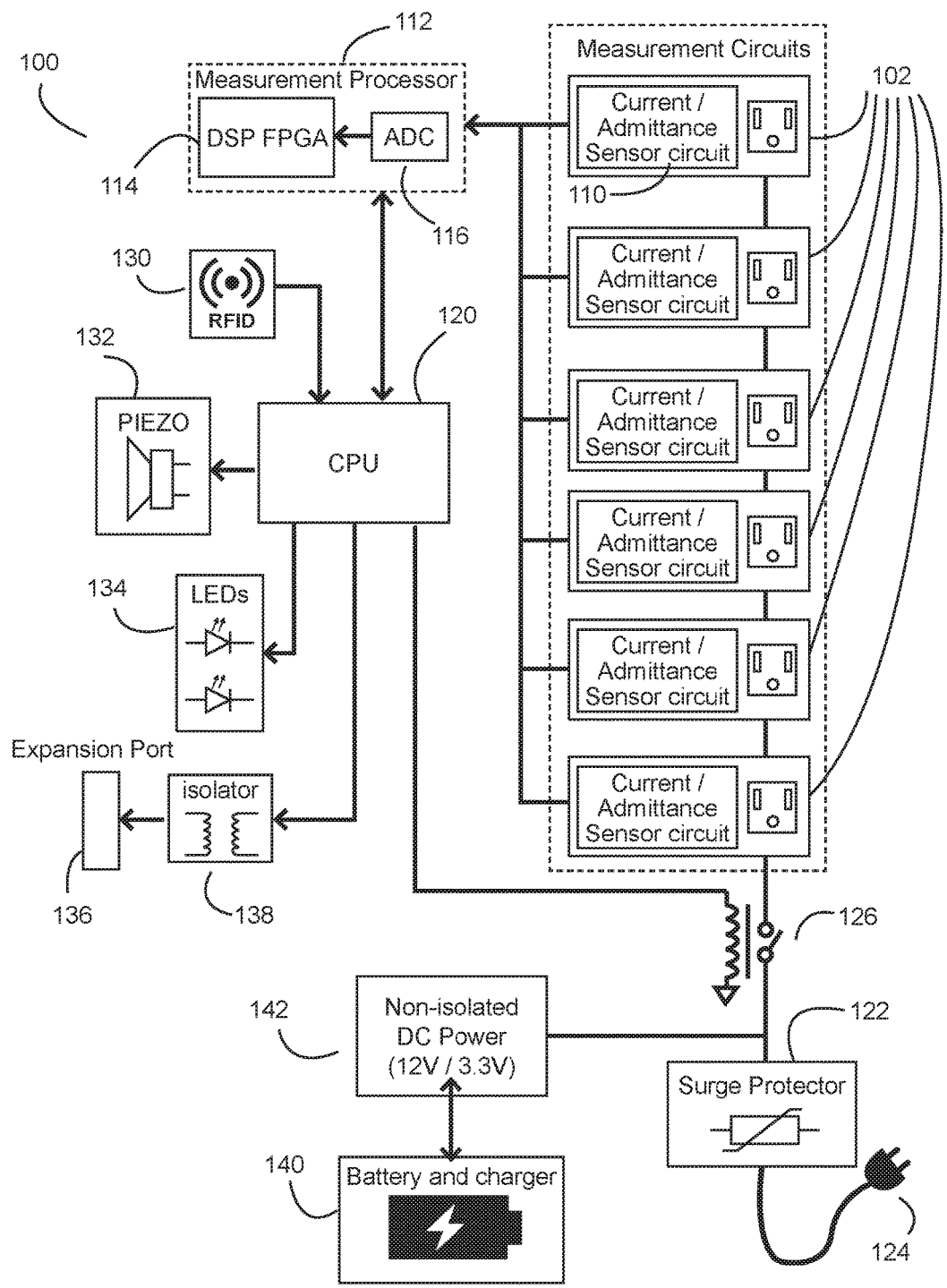
FIG. 1C shows an example system diagram of an example power strip.

FIG. 1C shows a high-level system block diagram for an example power strip 100. In this example, the power strip 100 includes a circuit that allows the power strip 100 to continuously and/or periodically measure electrical characteristics of the electrical appliances connected to the sockets 102. The power strip 100 may enunciate an alarm or other type of indication if these characteristics deviate significantly from their set points. As examples, the measured electrical characteristics may include admittance characteristics of the connected electrical appliances and/or current draw characteristics of the connected electrical appliances. Such activities can be performed on a per-socket basis so that alarms can be independently triggered for each socket 102.

The example power strip 100 of FIG. 1C includes a current/admittance sensor circuit 110 connected to each socket 102. These circuits 110 can sense the admittance and current draw characteristics of a connected electrical appliance through each socket 102. The power strip 100 may also include one or more processors for processing the sensed admittance and current draw characteristics to make decisions about how to set alarm thresholds and monitor for alarm triggers. For example, a measurement processor 112 can process the sensed admittance and current draw characteristics to compute a plurality of data values that represent the sensed admittance and current draw characteristics. It should be understood that these computed values need not be precise measurements such as admittance in units of Siemens. Instead, the computed values need only be indicative of the admittance and/or current draw characteristics of the connected appliances. The measurement processor 112 may include an analog to digital converter (ADC) 116 and a digital signal processor (DSP) such as a field programmable gate array (FPGA) 114 that performs computations on the digitized admittance and current draw signals. Also, a processor 120 such as a CPU or microcontroller unit (MCU) can process the computed measurements from the measurement processor 112 can make decisions about how to set alarm thresholds and whether to trigger alarms based on these thresholds. Processor 120 can be programmed with a plurality of processor-executable instructions that can be stored in a non-transitory computer-readable storage medium such as a memory accessible to processor 120.

The power strip 100 of FIG. 1C may also include a surge protector circuit 122 that provides surge protection that is in-line with incoming power received via plug 124 from a wall outlet or the like that provides the power strip 100 with a source of AC power. The power strip 100 may also include a switch 126 that is operable to connect/disconnect the sockets 102 to/from the incoming power.

Processor 120 may be in communication with an interface 130 through which credentials for authorized users are received (to facilitate control decisions such as arming, disarming, and/or calibrating the power strip 100). Examples of techniques that can be used for whitelisting authorized users and authenticating authorized users are described in U.S. Pat. No. 9,892,604 and U.S. Pat. App. Pub. 2017/0300721, the entire disclosures of which are incorporated herein by reference. Processor 120 may also be in communication with a piezo element 132 such as a speaker that can enunciate an alarm if the processor determines that an alarm security condition is present. Processor 120 may also be in communication with one or more status indicators (e.g., LEDs) that provide a visual indication of an operational status for the power strip (e.g., armed, disarmed, alarming, etc.).

The processor 120 may also be in communication with an expansion port 136 via an isolation circuit 138. The expansion port 136 can provide connectivity for the power strip 100 with a number of peripheral devices, examples of which are discussed below.

It should be understood that the power strip 100 shown by FIG. 1C is an example, and the power strip 100 may include more or fewer components than shown by FIG. 1C. For example, if a practitioner chooses not to provide for an expansion capability, the expansion port 136 and isolation circuit 138 may be omitted. As another example, another practitioner may choose to consolidate the processing capabilities of processors 112 and 120 into a single processor. As yet another example, any of interface 130, piezo element 132, and/or status indicators 134 may be omitted if desired by a practitioner. Further still, if a practitioner wants to permit the power strip 100 to wirelessly communicate with remote computer systems, the strip 100 may also include a wireless transceiver or the like to provide connectivity with a wireless network. Such a wireless transceiver can permit the power strip to serve as a wireless node in a wirelessly connected environment such as that described by US Pat. App. Pub. 2017/0164314, U.S. provisional patent application Ser. No. 62/650,992, filed Mar. 30, 2018 and entitled "Wirelessly Connected Environment of Wireless Nodes", U.S. patent application Ser. No. 16/001,601, filed Jun. 6, 2018 and entitled "Location Tracking of Products and Product Display Assemblies in a Wirelessly Connected Environment", published as US Pat. App. Pub. 2018/0288720, U.S. patent application Ser. No. 16/001,605, filed Jun. 6, 2018 and entitled "Remote Monitoring and Control over Wireless Nodes in a Wirelessly Connected Environment", published as US Pat. App. Pub. 2018/0288721, and U.S. patent application Ser. No. 16/001,631, filed Jun. 6, 2018 and entitled "Wirelessly Connected Hybrid Environment of Different Types of Wireless Nodes", published as US Pat. App. Pub. 2018/0288722, the entire disclosures of which are incorporated herein by reference. Through such wireless connectivity, the power strip 100 can be remotely monitored and controlled (e.g., by delivering notifications about alarms to responsible personnel via messaging to portable computing devices and the like, by remotely arming/disarming power strips (or individual sockets 102 within the power strip 100) in response to commands from the remote computer system, etc.). Still other variations are possible.

In order to control the security function of the power strip 100 in example embodiments, two basic phases of operation occur. A first phase comprises a calibration phase, and a second phase may comprise a monitoring phase. During the calibration phase, for example, the system may characterize the device attached to each socket to determine the general current and/or admittance characteristics of the device so that an appropriate alarm threshold can be determined for each device. After each device has been characterized and the alarm criteria and/or thresholds have been determined, the monitoring phase is entered. In the monitoring phase, the same circuits are used to continuously or regularly monitor each socket 102 for changes and/or trigger an alarm if the limits set in the calibration phase are exceeded.

In an example embodiment, the power strip 100 (which may described as a "Sell Plug" or "Secure Plug") uses two distinctly different types of measurements that it performs in both the calibration and/or monitoring phases of operation. These different measurements may be current measurement and/or admittance measurement. The admittance measurement may be to determine the length of the cable used by the device to connect with socket 102 and the type of load represented by the device connected to that cable. The current measurement may be used to determine the real part of the current drawn by the device. By looking at and/or examining how these two parameters vary under multiple specified conditions during the calibration phase, the type of device connected to socket 102 can be determined. Once the type of device has been determined, the alarm criteria may be set accordingly to thereby customize the alarm criteria to the device that is connected to socket 102.

Figure 2:
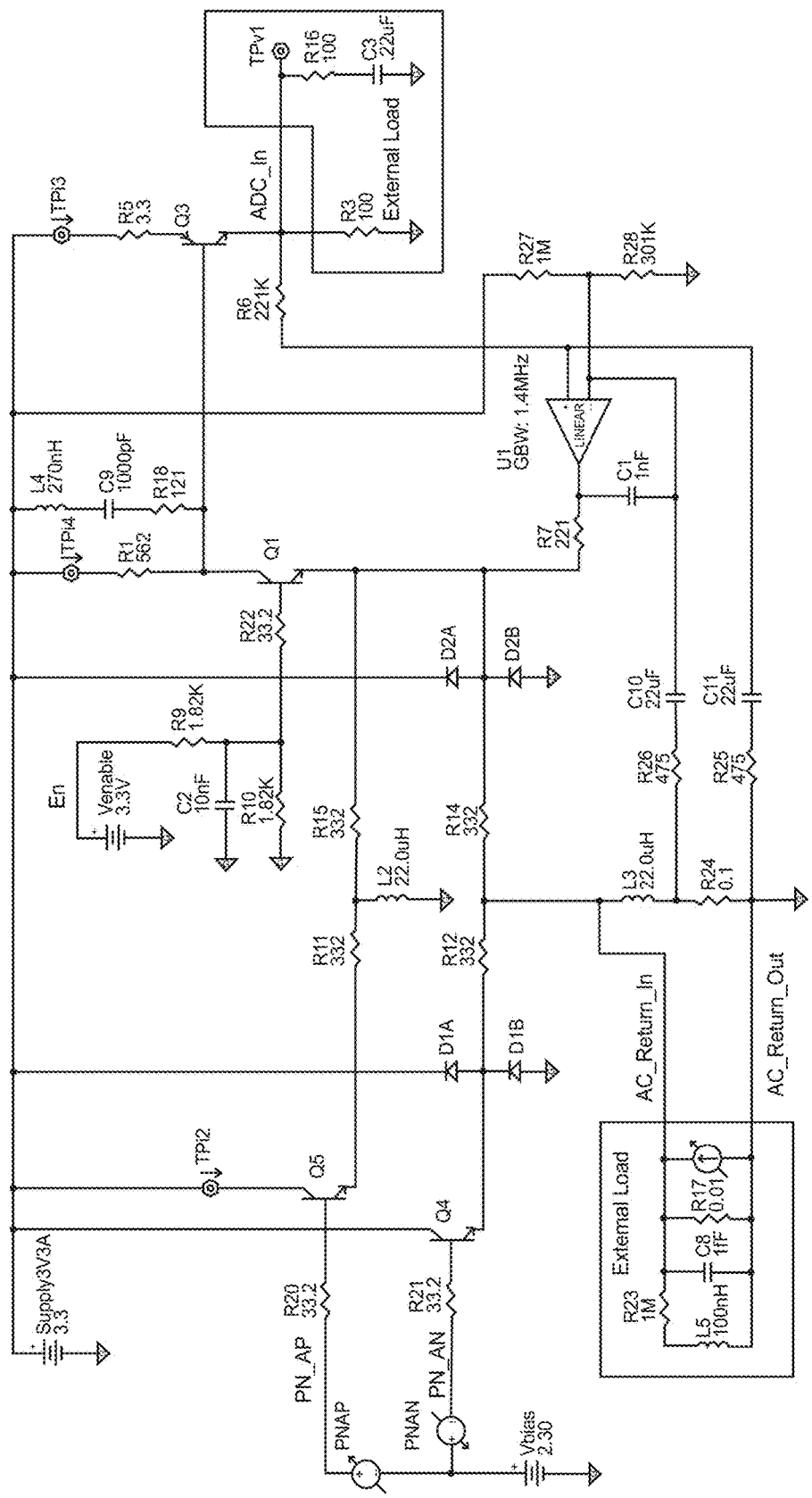
FIG. 2 shows an example admittance and current sensor circuit.

FIG. 2 shows an example embodiment of a current/admittance sensor circuit 110 that can be employed by the power strip 100 to sense admittance and current draw through a socket 102. As shown by FIG. 1C, there may be a single sensor circuit 110 for each socket 102 of the power strip 100. In an example embodiment, the sensor circuit 110 may comprise an analog circuit that stimulates the device on its corresponding socket 102, and/or amplifies the response received so that the response can be converted to the digital domain and/or processed.

In some embodiments, the sensor circuit 110 may measure admittance by generating stimulation signals at a plurality of different frequencies (e.g., 12 different frequencies, although a different number of frequencies may be used if desired by a practitioner), and/or by recording the response from the socket 102 at each of these twelve frequencies. This stimulation signal may comprise differential analog signals that may be generated by a digital signal processor (DSP) such as FPGA 114. When applied to the bases of transistors Q4 and/or Q5 (as seen in FIG. 2), transistors Q4 and/or Q5 make up a modified bridge circuit along with resistors R11, R12, R14, and R15. An input signal may be buffered by followers Q4 and/or Q5. The input signal may be presented to a fixed inductance, for example 22 micro-Henry, load on one side, and a variable inductance, for example 22 micro-Henry, load in parallel with the neutral wire of the external cable connected to the socket load. A resulting signal is summed at the emitter of transistor Q1. The resulting signal represents the difference in admittance between the fixed inductor and the variable inductor resulting from the parallel combination of the fixed, for example, 22 micro-Henry inductor and the cable load. This difference represents the admittance of the cable at that frequency. By performing a differential measurement, any noise on the input signal may be nulled out because it is common to both sides and is therefore not part of the differential result. The summed signal is amplified by common base amplifier Q1 with a snubber circuit on the output to reduce ringing at the resonant frequency of the inductors. Additional gain is provided by emitter degenerated common emitter amplifier Q3. The output of Q3 is presented to the ADC 116 for conversion into a digital signal. Operational amplifier U1 provides feedback around the two gain stages to keep the system biased to a point half way between optimization for the ADC (analog-to-digital) input. The signal is digitized at 100 MHz, and the digital representation is then processed by the DSP FPGA 114.

As noted, in an example embodiments, the admittance can be measured at 12 different frequencies. Two frequencies per octave can be used. These frequencies can be integer divides of the 100 MHz clock. The divide ratios may comprise 2, 3, 4, 6, 8, 12, 16, 24, 32, 48, and/or 64. This provides frequency coverage between 1.5 MHz and 50 MHz. All frequencies are run sequentially through each socket. The total time to measure all frequencies on each socket is approximately 6 ms. The stimulus and/or response are both controlled by the DSP FPGA 114 so that the phase of the response relative to the stimulus is also known. Both the amplitude and phase of the response are used by the FPGA 114 to determine the admittance at a given frequency.

In example embodiments, the sensor circuit 110 can also be used to measure the current. The current can measured across a sense resistor R24 which is in series with the neutral line of the socket. Resistors R25 and/or R26 set the gain to amplifier U1 which multiplies the result up to the appropriate input level for the ADC with the help of transistor amplifiers Q1 and/or Q3.

The current measurement circuit can be triggered by the FPGA 114 at a known phase with the AC line. The FPGA 114 makes a series of measurements at precise times for 100 ms. These measurements capture both the magnitude and the phase of the current so that reactive and/or resistive loads can be differentiated. The raw measurements are corrected for known phase delays in the circuit to present an accurate representation of the magnitude and/or phase of the current drawn by the device connected to the socket 102.

In some embodiments, the FPGA 114 is responsible for generating stimulus to the sensor circuit 110 and/or processing the response received back from the sensor circuits 110. The FPGA 114 is advantageous as a compute resource for processing the signals from sensor circuits 110 because the FPGA 114 provides faster performance relative to a conventional microcontroller or the like while providing more flexibility than an application-specific integrated circuit (ASIC) because the FPGA can be re-configured in the field post-manufacture, thereby allowing practitioners to upgrade and/or modify the processing logic implemented by the FPGA 114 over time. The faster performance can be advantageous in reducing the time needed to process signals used as part of the calibration and monitoring processes, which can minimize undesirable delays in these processes. Functions can be implemented on the FPGA 114 in synthesizable RTL (register-transfer level) code.

In example embodiments, admittance testing can performed with the measurement processor 112. To perform admittance testing, the measurement processor 112 generates each of the twelve measurement frequencies via integer divide of the 100 MHz DSP clock. The measurement processor 112 also generates a pseudo noise (PN) sequence. This is a series of ones and/or zeros generated by a linear feedback shift register. Each frequency is then modulated by this PN sequence to spread the spectrum of the injected signal to prevent it from radiating in violation of emission standards. This modulated PN sequence may then be sent to the sensor circuits 110.

Figure 3:
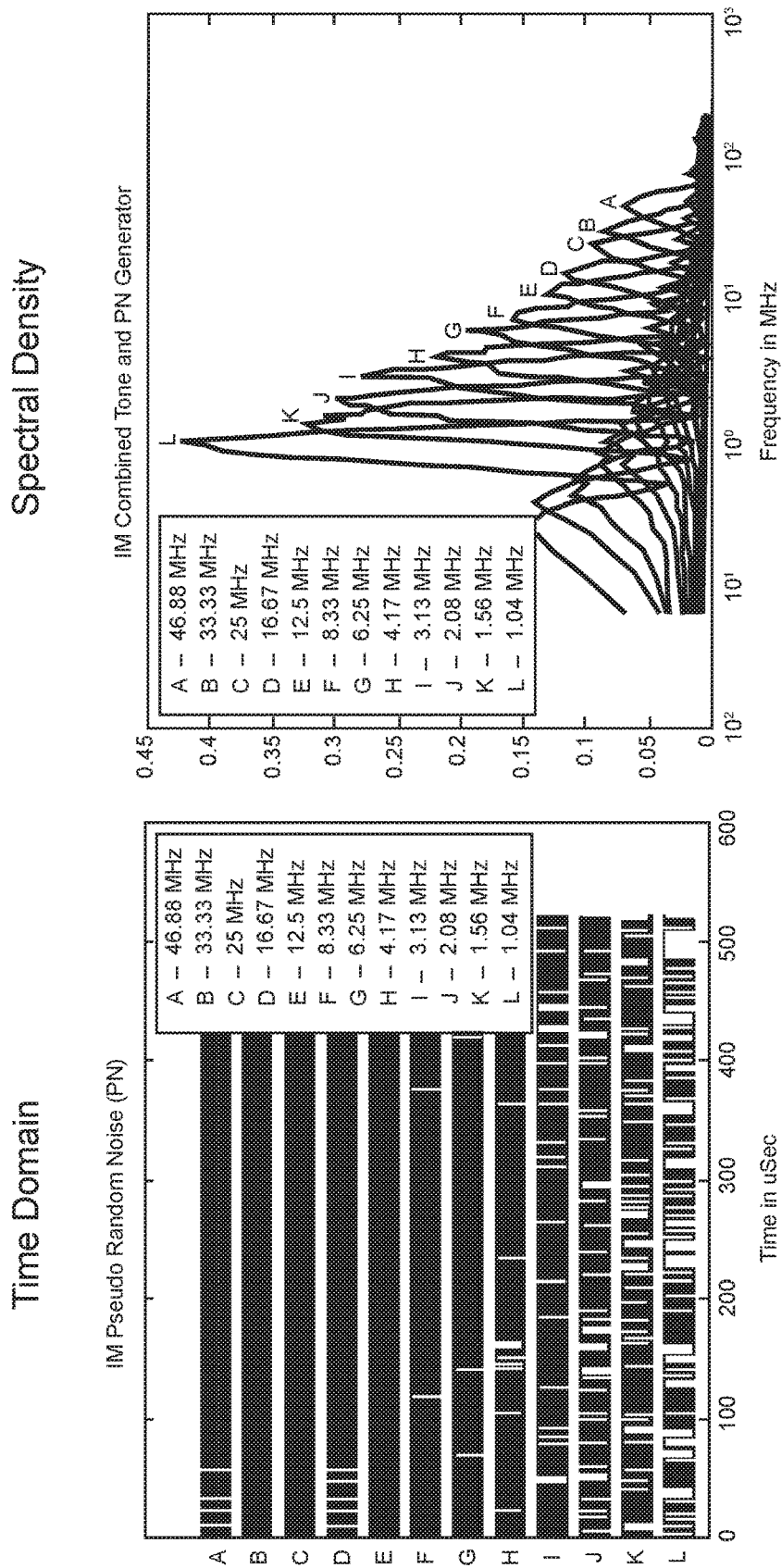
FIG. 3 shows an example graphical view of the sensors of a power strip against a pseudo noise modulated signal according to an example embodiment.

FIG. 3 illustrates correlation in response from the sensors against the pseudo noise modulated signal that may be conveyed to the sensors to extract cable admittance characteristics from one or more sensor outputs. The correlation function aligns the phase of the two signals (stimulus and/or response) such that both magnitude and/or phase information can now be extracted from the response. Since the response was the difference in response of the cable to the response of a known load on the other side of the sensor, the result is a fairly accurate representation of the real and imaginary reactance of the load on the socket. Absolute accuracy is not critical as all that is required is the ability to sense a change that is representative of the removal or modification of the load on a socket. In example embodiments, the design target is about 5 Ohms of impedance or less than 1 inch of cable length change. This accuracy is limited by parasitics, such as parasitic capacitances and/or inductances in the system, but performs and acceptable job of measuring complex admittance across frequency.

Figure 4:
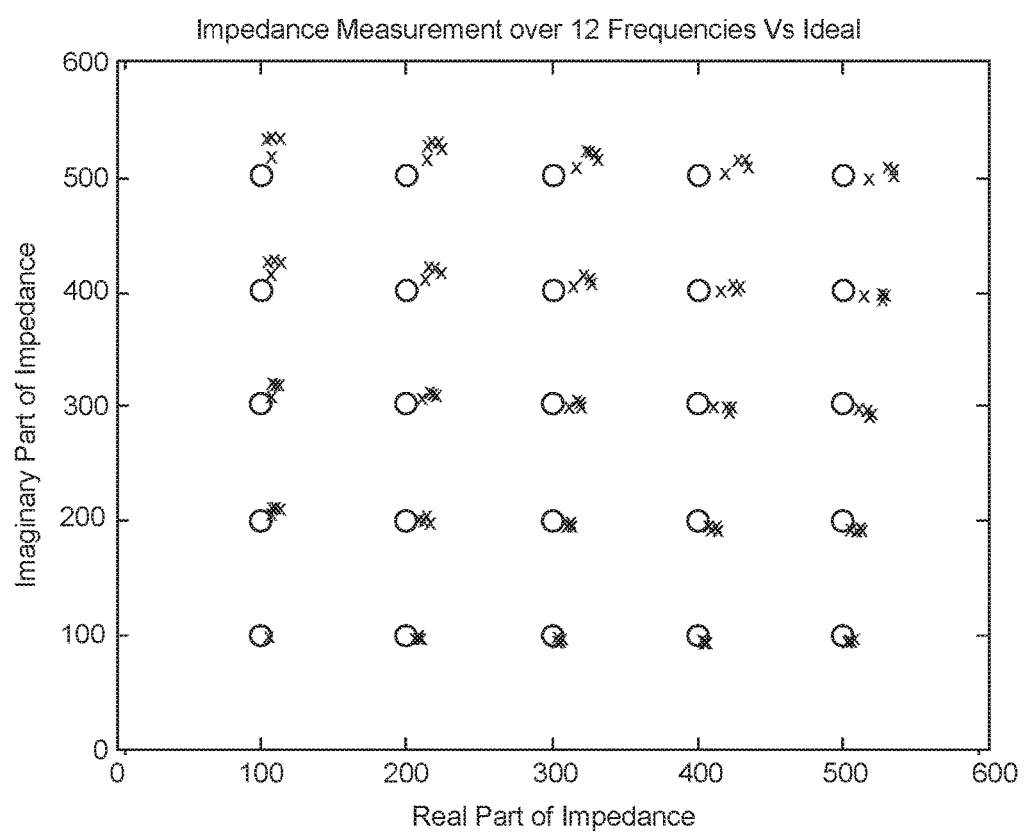
FIG. 4 shows an example graphical view of actual impedance measurements obtained by a power strip over multiple frequencies compared against ideal impedance measurements according to an example embodiment.

FIG. 4 illustrates an example of actual impedance measurements over multiple frequencies compared against ideal impendence measurement. As stated above, admittance measurements are done by frequency. They are initiated by the processor 120 with an admittance read request for a given socket 102. The FPGA 114 generates the stimulus, processes the response, and/or signals the processor 120 that the result is ready to be read. The processor 120 receives a complex result from the FPGA 114 representing the real and/or imaginary part of the admittance.

In example embodiments for current measurements, the measurement processor 112 can generate five measurement triggers over 100 milliseconds. These triggers can span 6 cycles at 60 Hz or 5 cycles at 50 Hz, although other cycle or frequency breakdowns are possible. These triggers can be generated at precise phase shifts from the line power that is delivered to each of the sockets 102. The resulting measurements represent the current at those precise phase delays relative to the mains power. The measurement processor 112 then computes the average magnitude and/or relative phase of the measured current to the mains voltage.

Current measurements may be performed in response to a signal trigger request from the processor 120. The processor 120 requests a current measurement from the FPGA 114. The FPGA 114 arms and waits for the next cycle of the mains power to trigger it. Once it receives the trigger, the FPGA 114 makes its five measurements, averages the results, and/or provides a complex current value representing magnitude and/or phase back to the processor 120 on completion.

As noted, processor 120 can control user interfaces such as piezo element 132 and status indicators 134. However, the processor 120 may also perform additional roles in the system. For example, the processor can control the calibration process and the monitoring process for alarm generation. The sensor circuits 110 and FPGA 114 can provide real time data on the status of the loads on each socket 102, while the processor 120 can in turn perform calibration and limit checking based on that data.

Calibration:

In example embodiments, the power strip 100 can be capable of providing security functions for a number of different types of electrical appliances/devices that may present a wide range of different loads to the sockets 102. A particular challenge is for the power strip to provide an effective security function when the socket 102 is connected to an in-line power supply or power transformer such as USB chargers or power bricks. These loads present specific challenges in that they can be disconnected at more than one point (e.g., at the power strip, at the power supply, or at the device). It is desirable for any disconnect at any of these points to generate an alarm. For example, it is desirable for the power strip 100 to trigger an alarm if a thief disconnects an electronic device from a power brick while leaving the power brick connected to the socket 102. The calibration process described herein can be employed to learn and/or detect the current and/or admittance characteristics of whatever devices are connected to sockets 102, where these characteristics may be unique for each device or class of devices.

Figure 5A:
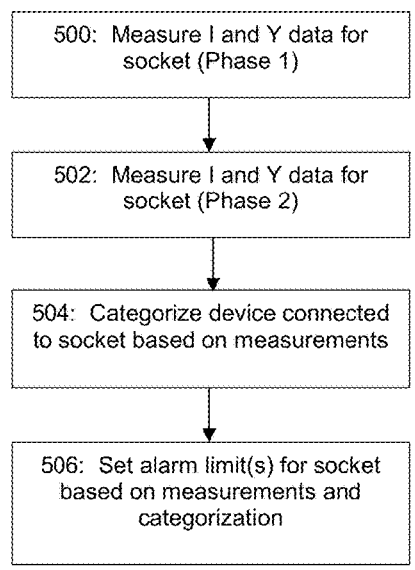
FIG. 5A shows an example calibration process flow.

To support a wide range of devices, a two stage calibration process can be employed in an example embodiment. This calibration process can gather data on the current and/or admittance characteristics of the connected device through socket 102 under different conditions, and the calibration process uses these characteristics to set the alarm thresholds for each device. FIG. 5A shows an example calibration process flow that can be used in an example embodiment.

At step 500, the system measures admittance and current draw characteristic data through the socket for a first calibration phase (Phase 1). To perform these measurements, a plurality of stimulation signals as discussed above can be applied to the socket to trigger a response from whatever may be connected to the socket. The responses to the stimulation signals can be processed to obtain the Phase 1 admittance characteristic and current draw characteristic measurements. These measurements can be repeated a plurality of times (e.g., 10 times), and the measurements can be averaged together to aggregate the measurements to single admittance characteristic and current draw characteristic values (e.g., Yavg1 and Iavg1). As noted above, these measurements need not be precise computations of admittance and current in terms of Siemens and Amperes. For example, the measured admittance characteristic need only be indicative of the resistive and reactive portions of a load (or the conductance and susceptance portions of the load) presented to the socket by whatever is connected to the socket. If desired by a practitioner, different weights (W) can be applied to different measurements as part of the averaging process. Such a vector of weights (W) can be stored in and retrieved from memory as needed. Sensor circuit 110 and DSP 114 can be used to support these operations. The Phase 1 measurements can be used by the system to help define the alarm limit(s) that will be used to test for alarm events.

At step 502, the system measures admittance and current draw characteristic data through the socket for a second calibration phase (Phase 2). To perform these measurements, the system can once again apply the stimulation signals to the socket to trigger a response from whatever may be connected to the socket. The responses to these stimulation signals can be processed to obtain the Phase 2 admittance characteristic and current draw characteristic measurements. Once again, these measurements can be repeated a plurality of times (e.g., 10 times), and the measurements can be averaged together to aggregate the measurements to single admittance characteristic and current draw characteristic values (e.g., Yavg2 and Iavg2). Also, as noted, different weights (W) from a stored weights vector can be applied to different measurements as part of the averaging process. Sensor circuit 110 and DSP 114 can be used to support these operations. The Phase 2 measurements can be used by the system, in combination with the Phase 1 measurements to help categorize the device connected to the socket.

At step 504, the system categorizes the device connected to the socket 102 based on the Phase 1 measurements and the Phase 2 measurements. Based on this categorization, the system can then set one or more alarm limits for the socket accordingly (step 506).

As noted above, the system preferably supports security functions for different types of devices connected to socket 102.

One type of device that can be connected to the socket is a device that includes a cable such as a power cord that plugs into socket 102. Such devices typically operate from AC power. In some instances, the cable may be detachable from the device, but not necessarily. Examples of such cabled devices include most types of television sets, vacuum cleaners, lamps, etc. Such cabled devices typically have a power switch or the like that allows power to be turned off for the device. It is preferred that cabled devices be switched to be in an unpowered state during Phase 1 and Phase 2 of the calibration process so that the calibrated power strip 100 can be insensitive to variations in characteristics such as current draw that may be experienced by a powered device. One complicating factor that the system can account for with cabled devices is that some cabled devices exhibit different current draw characteristics when in an unpowered state. If the device includes circuitry that allows it to operate in a standby mode while unpowered, the device may still draw current even when turned off. Television sets are a type of cabled device that typically include standby mode circuitry (as are devices such as Blu-Ray players and DVD players). However, for devices that lack such circuitry for a standby mode, there would be no current draw when turned off. As discussed below, the system can be designed to use the Phase 1 and Phase 2 measurements to distinguish between these categories of devices and then tailor the alarm limits accordingly.

Another type of device that can be connected to the socket is a device that connects to the socket through an external power transformer such as a power brick. Such devices typically operate from DC power, and the external transformer operates to convert AC power from socket 102 to a DC power for use by the device. For ease of reference, such external power transformers will be referred to as power bricks. Power bricks are typically detachably connectable to the devices they power. Examples of such power bricked devices include most types of laptop computers, tablet computers, smart phones, etc. Power bricks represent a particular challenge from a security perspective because it is desirable for the system to detect both a situation where the power brick and device are together removed from the socket 102 and a situation where the device is removed from the power brick but the power brick remains connected to the socket 102. Furthermore, different types of power bricks exhibit different electrical characteristics that pose further challenges for the security function of the socket. For example, a first type of power brick (which can be referred to as a regular power brick) will draw some current when connected to socket 102 even if the regular power brick is not connected to a device; while a second type of power brick (which can be referred to as a lite power brick) will not draw any appreciable current when connected to socket when no device is connected to the lite power brick. USB chargers for smart phones are often examples of lite power bricks. As discussed below, the system can be designed to use the Phase 1 and Phase 2 measurements to distinguish between these power bricked categories of devices and then tailor the alarm limits accordingly.

During calibration, it is preferred that the devices remained unpowered (e.g., the power switches turned off) for both Phase 1 and Phase 2 calibration. For power bricked devices, the Phase 1 calibration occurs when the power brick is connected to the socket but the device is not connected to the power brick, and the Phase 2 calibration occurs when the power brick is connected to the socket and the (turned off) device is connected to the power brick.

Figure 5B:
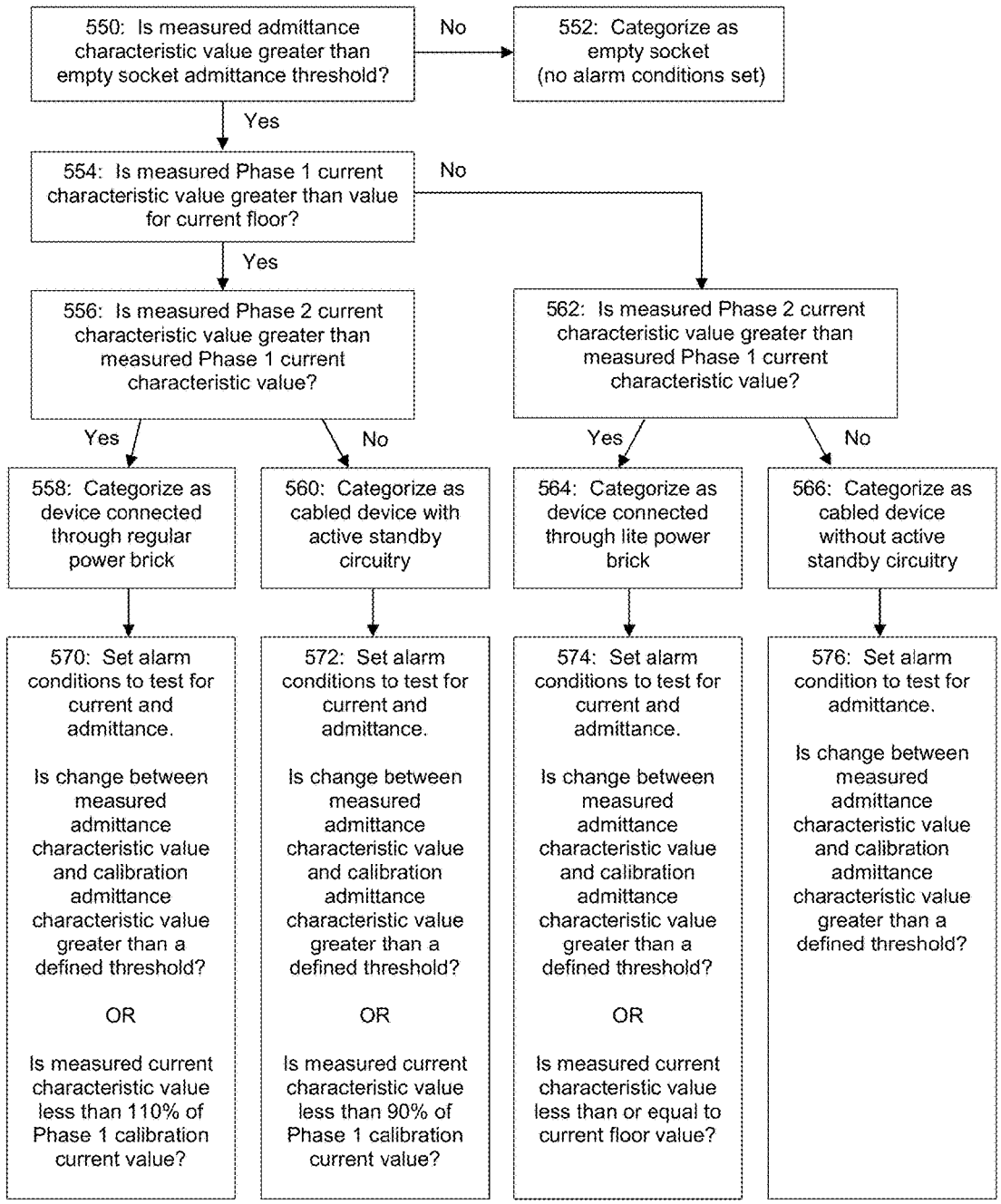
FIG. 5B shows an example categorization and alarm limit setting process flow.

FIG. 5B shows an example process flow that can be used for the categorization and alarm limit setting steps 504 and 506 of FIG. 5A. Different categories of connected devices as discussed above will present different admittance and current draw characteristics, and the two phases of calibration can be used to distinguish between these different categories of connected devices. In an example embodiment, processor 120 can perform a variety of comparison and testing operations to support categorization efforts.

For example, an admittance floor value (Y0) can be used to represent the admittance of an empty socket. This Y0 value can be stored by the system and used as a threshold to test for an empty socket condition. Hence, the system can perform a comparison between the Phase 1 measured admittance characteristic value (e.g., Yavg1) and the admittance floor value (Y0) (step 550). If Yavg1 is greater than Y0, this would indicate that something is connected to the socket (and the process flow can proceed to step 554). Otherwise, the system will conclude that the socket is empty, and the process flow can transition to step 552 where the socket is categorized as being empty (in which case no alarm limit would be set). As an example, the comparison that is performed at step 550 can compare the square of the absolute value of Yavg 1 to the square of the absolute value of Y0.

A current floor value (I0) can be used to represent no current draw through the socket (where some measurement noise tolerance may be factored in). As such, I0 can be conceptually zero plus some tolerance margin to account for measurement noise. This I0 value can be stored by the system and used as a threshold to help further categorize a connected device. At step 554, the system compares the Phase 1 measured current characteristic value (e.g., Iavg1) with the current floor value (I0). If a cabled and non-bricked device that lacks an active standby mode is connected to the socket, the value of Iavg1 should not be greater than I0. Also, if a lite power brick is connected to the socket, the current draw by the lite power brick will be negligible and should also fall below I0. Hence, the condition where Iavg1 is not greater than I0 could also indicate the presence of a lite power brick. By contrast, a regular power brick or a cabled device with an active standby mode both would exhibit an Iavg1 that is greater than I0. Hence, with reference to FIG. 5B, the transition from step 554 to step 556 indicates the presence of either a regular power brick or a cabled device with an active standby mode in the socket, and the transition from step 554 to step 562 indicates the presence of either a lite power brick or a cabled device without an active standby mode in the socket. The Phase 2 measurements can then be used to resolve further categorization.

At step 556, the system is choosing between candidates of a regular power brick and a cabled device with an active standby mode. To distinguish between the two at step 556, the system compares the Phase 2 measured current characteristic value (e.g., Iavg2) with the Phase 1 measured current characteristic (e.g., IAvg1). If a regular power brick is connected to the socket, the Phase 2 measurements will be made when the device is connected to the regular power brick. This device connection will increase the current draw for Phase 2 relative to Phase 1. Hence, an increase in current draw for Phase 2 relative to Phase 1 at step 556 would indicate the presence of a regular power brick. In this case, the process flow can transition to step 558 where the socket is characterized as being connected to a regular power brick. By contrast, if a cabled device with an active standby mode is connected to the socket, the Phase 2 current draw should be the same as the Phase 1 current draw. Hence, if the current draw for Phase 2 does not increase relative to that of Phase 1, this would indicate the presence of a cabled device with an active standby mode. In this case, the process flow can transition to step 560 where the socket is characterized as being connected to a cabled device with an active standby mode. It should be understood that the comparison at step 556 could factor in some measurement noise by requiring a distinguishing difference in the Phase 2 current draw to be greater than a defined threshold in order to conclude that the Phase 2 current draw qualifies as an increase from the Phase 1 current draw.

At step 562, the system is choosing between candidates of a lite power brick and a cabled device without an active standby mode. To distinguish between the two at step 562, the system compares the Phase 2 measured current characteristic value (e.g., Iavg2) with the Phase 1 measured current characteristic (e.g., Iavg1). If a lite power brick is connected to the socket, the Phase 2 measurements will be made when the device is connected to the lite power brick. This device connection will increase the current draw for Phase 2 relative to Phase 1. Hence, an increase in current draw for Phase 2 relative to Phase 1 at step 562 would indicate the presence of a lite power brick. In this case, the process flow can transition to step 564 where the socket is characterized as being connected to a lite power brick. By contrast, if a cabled device without an active standby mode is connected to the socket, the Phase 2 current draw should be the same as the Phase 1 current draw. Hence, if the current draw for Phase 2 does not increase relative to that of Phase 1, this would indicate the presence of a cabled device without an active standby mode. In this case, the process flow can transition to step 566 where the socket is characterized as being connected to a cabled device without an active standby mode. It should be understood that the comparison at step 562, similarly to the comparison step at 556, could factor in some measurement noise by requiring a distinguishing difference in the Phase 2 current draw to be greater than a defined threshold in order to conclude that the Phase 2 current draw qualifies as an increase from the Phase 1 current draw.

After the socket has been categorized, the system can customize one or more alarm limits accordingly.

At step 570, the system sets alarm limits for a socket categorized as being connected to a regular power brick. In this scenario, for an example embodiment, the system can employ either or both of first and second alarm limits that are based on admittance and current draw characteristics.

A first alarm limit defined at step 570 can test for whether the measured admittance characteristic (Y) for the socket has dropped below the Phase 1 admittance characteristic value (e.g., Yavg1). If so, this indicates that the power brick has been removed from the socket, and an alarm should be triggered. Any of a number of metrics can be used to test for this condition. For example, this first alarm limit condition can include a measurement noise tolerance if desired by a practitioner where the decrease in admittance needs to exceed a defined threshold (Ylim or Ylimit). In such an example, the system can trigger an alarm if the square of the difference between Y and Yavg1 exceeds Ylim. In another example, the first alarm limit can check whether Y is less than Yavg1 (e.g., the system can trigger an alarm if the square of Y is less than the square of Yavg1).

A second alarm limit defined at step 570 can test for whether the measured current characteristic (I) is less than a value above the measured Phase 1 current characteristic value (e.g., Iavg1) but below the measured Phase 2 current characteristic value (e.g., Iavg2). Given that the connection of a device to the regular power brick will cause an increase in the current draw relative to Iavg1, this test can identify situations where the device has been disconnected from the regular power brick but the power brick remains connected to the socket. That is because Iavg2 (where the device is connected) is greater than Iavg1 (where the regular power brick was connected by the device was not), Iavg1 can be used as a test for indicating disconnection of the device independently of disconnection of the regular power brick. In an example, this second alarm limit can test whether the newly measured current characteristic value (I) is less than 110% of the Phase 1 current characteristic value (Iavg1). If I is less than 110% of Iavg2, an alarm would trigger because this would indicate that either (1) both the regular power brick and device were disconnected from the socket (in which case the current draw would drop to zero) or (2) only the device was disconnected from the regular power brick while the regular power brick remained connected to the socket (in which case the current draw would drop to around Iavg1). While 110% is used as the scalar for Iavg1 in this example alarm limit, it should be understood that other scalars could be used (e.g., 105%, 115%, etc.).

At step 572, the system sets alarm limits for a socket categorized as being connected to a cabled device with an active standby mode that would draw current even when the device's power switch is turned off. In this scenario, for an example embodiment, the system can employ either or both of first and second alarm limits that are based on admittance and current draw characteristics.

A first alarm limit defined at step 572 can be the same alarm limit as described above for the first alarm limit at step 570. That is, the first alarm limit for step 572 can test for whether the measured admittance characteristic (Y) for the socket has dropped below the Phase 1 admittance characteristic value (e.g., Yavg1). If so, this indicates that the cabled device has been removed from the socket, and an alarm should be triggered. As described above, any of a number of metrics can be used to test for this condition.

A second alarm limit defined at step 572 can test for whether the measured current characteristic (I) is less than a value slightly below the measured Phase 1 current characteristic value (e.g., Iavg1). Given that the standby mode will draw largely the same current for both the Phase 1 and Phase 2 calibration measurements, the system can set the alarm limit to be a value slightly below the Phase 1 current draw characteristic value (e.g., Iavg1), such as 90% of Iavg1. Thus, if the cabled device is removed from the socket, the newly measured current draw characteristic value (I) will fall below 90% of Iavg1, and the system can trigger an alarm. Similarly, if the cable is cut or detached from the device, this would also cause I to fall below 90% of Iavg1, and the system can trigger an alarm. While 90% is used as the scalar for Iavg1 in this example alarm limit, it should be understood that other scalars could be used (e.g., 85%, 95%, etc.).

At step 574, the system sets alarm limits for a socket categorized as being connected to a lite power brick. In this scenario, for an example embodiment, the system can employ either or both of first and second alarm limits that are based on admittance and current draw characteristics.

A first alarm limit defined at step 574 can be the same alarm limit as described above for the first alarm limit at steps 570 and 572. That is, the first alarm limit for step 574 can test for whether the measured admittance characteristic (Y) for the socket has dropped below the Phase 1 admittance characteristic value (e.g., Yavg1). If so, this indicates that the lite power brick has been removed from the socket, and an alarm should be triggered. As described above, any of a number of metrics can be used to test for this condition.

A second alarm limit defined at step 574 can test for whether the measured current characteristic (I) is less than or equal to the current floor (I0). Given that the lite power brick will not draw any appreciable current when a device is not connected to the lite power brick (but will when the device is connected to the power brick), this second alarm limit can be used to test for the situation where the device has been removed from the lite power brick but the lite power brick remains connected to the socket. In this scenario, the newly measured I will drop to be the same as or less than I0, and the system should trigger an alarm.

At step 576, the system sets alarm limits for a socket categorized as being connected to a cabled device without an active standby mode. In this scenario, for an example embodiment, the system can employ an alarm limit that is based on the admittance characteristic. The alarm limit defined at step 576 can be the same alarm limit as described above for the first alarm limit at steps 570, 572, and 574. That is, the first alarm limit for step 576 can test for whether the measured admittance characteristic (Y) for the socket has dropped below the Phase 1 admittance characteristic value (e.g., Yavg1). If so, this indicates that the cabled device has been removed from the socket, and an alarm should be triggered. As described above, any of a number of metrics can be used to test for this condition.

In setting these alarm limits, it should be understood that a practitioner may choose to vary the tolerance thresholds and other conditions based on the determined categorization for the socket. For example, the value for Ylim used in the admittance-based alarm limits can be different values depending on the categorization. Thus, the Ylim used for a cabled device can be a different Ylim than is used for a regular power brick or a lite power brick. Similarly, different Ylim values could be used for regular power bricks versus lite power bricks. Similarly, the value for I0 used for a lite power brick could be different than the I0 used during calibration at step 554.

Further still, different categorization process flows could be used if desired by a practitioner. For example, the system process flow could perform the set of condition checks needed for categorization and then apply Boolean logic to the results to reach conclusions about categorization. Example logic tables for such operations are below:

TABLE 1

Tests and Outcomes

| Test | Outcomes |
| --- | --- |
| Test A: Is measured Phase 1 admittance characteristic value greater than empty socket admittance value? (e.g., is Yavg1 > Y0?) | Condition (1): Test is FALSE<br>Condition (2): Test is TRUE |
| Test B: Is measured Phase 1 current characteristic value greater than current floor value? (e.g., is Iavg1 > I0?) | Condition (3): Test is FALSE<br>Condition (4): Test is TRUE |
| Test C: Is measured Phase 2 current characteristic value greater than measured Phase 1 current characteristic value? (e.g., Is Iavg2 > Iavg1?) | Condition (5): Test is FALSE<br>Condition (6): Test is TRUE |

TABLE 2

Categories and Conditions

| Category | Conditions |
| --- | --- |
| Empty Socket | Condition (1) |
| Cabled Device with no Active Standby Mode | Conditions (2), (3), and (5) |
| Cabled Device with Active Standby Mode | Conditions (2), (4), and (5) |
| Regular Power Brick (with Connected Device) | Conditions (2), (4), and (6) |
| Lite Power Brick (with Connected Device) | Conditions (2), (3), and (6) |

Figure 6:
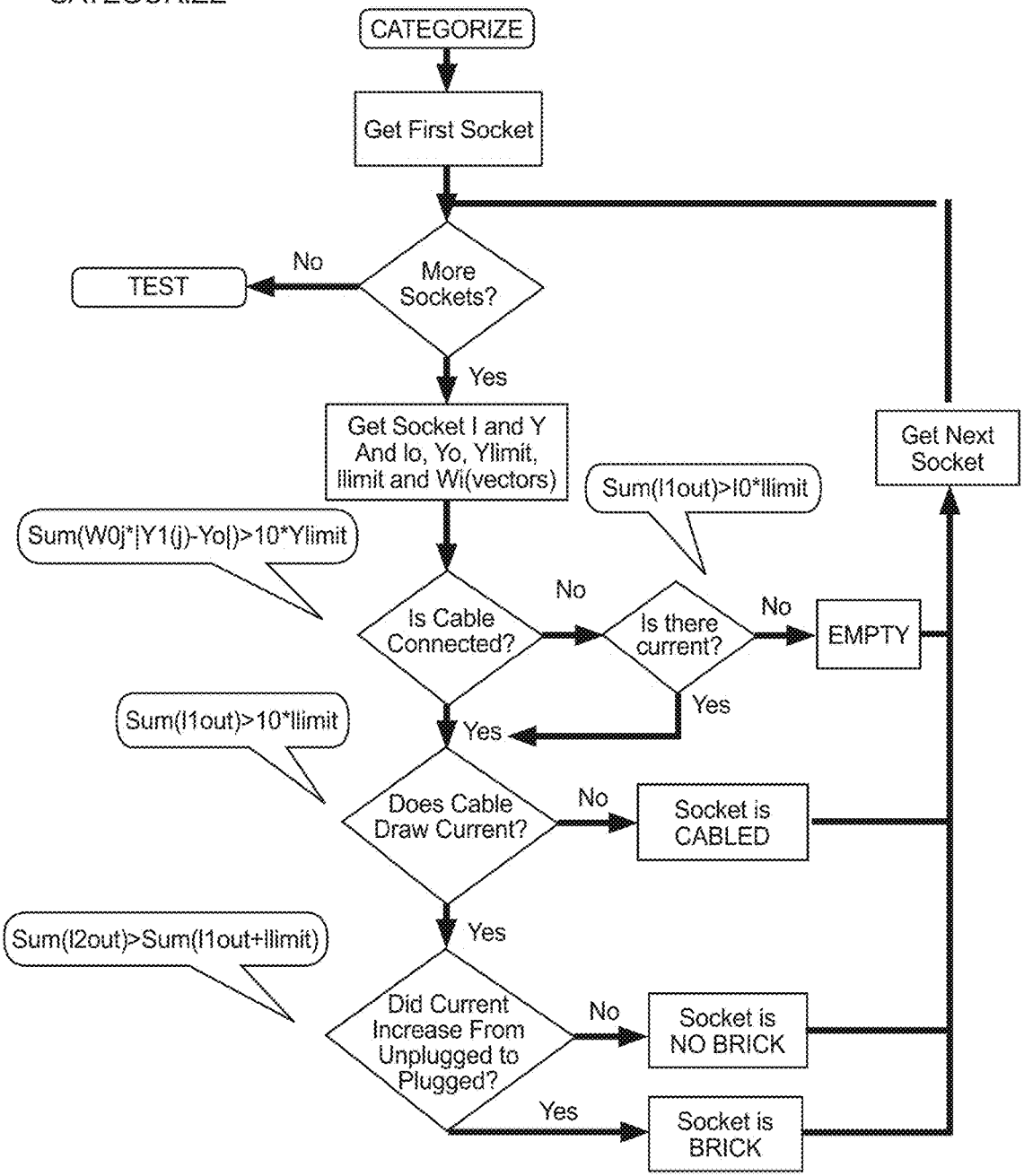
FIG. 6 shows another example categorization process flow.

Further still, some practitioners may not find it necessary to categorize on the same categories used by FIG. 5B. As an example, the categorization process flow of FIG. 6 can be employed to categorize sockets as between empty sockets, sockets connected to cabled devices, and sockets connected to regular power bricks.

Accordingly, the calibration and categorization techniques described herein permits the system to categorize devices connected to sockets 102 into different types of devices/loads, and where the alarm thresholds can be customized to the particular categorized type of device/load connected to a socket 102 while supporting the use of in-line power transformers and the like. In example embodiments, once the system has been calibrated, the alarm limits for each socket 102 can be stored in NVRAM (non-volatile random-access memory) of the power strip 100 so the system can be power cycled without repeating the calibration process.

Figure 7:
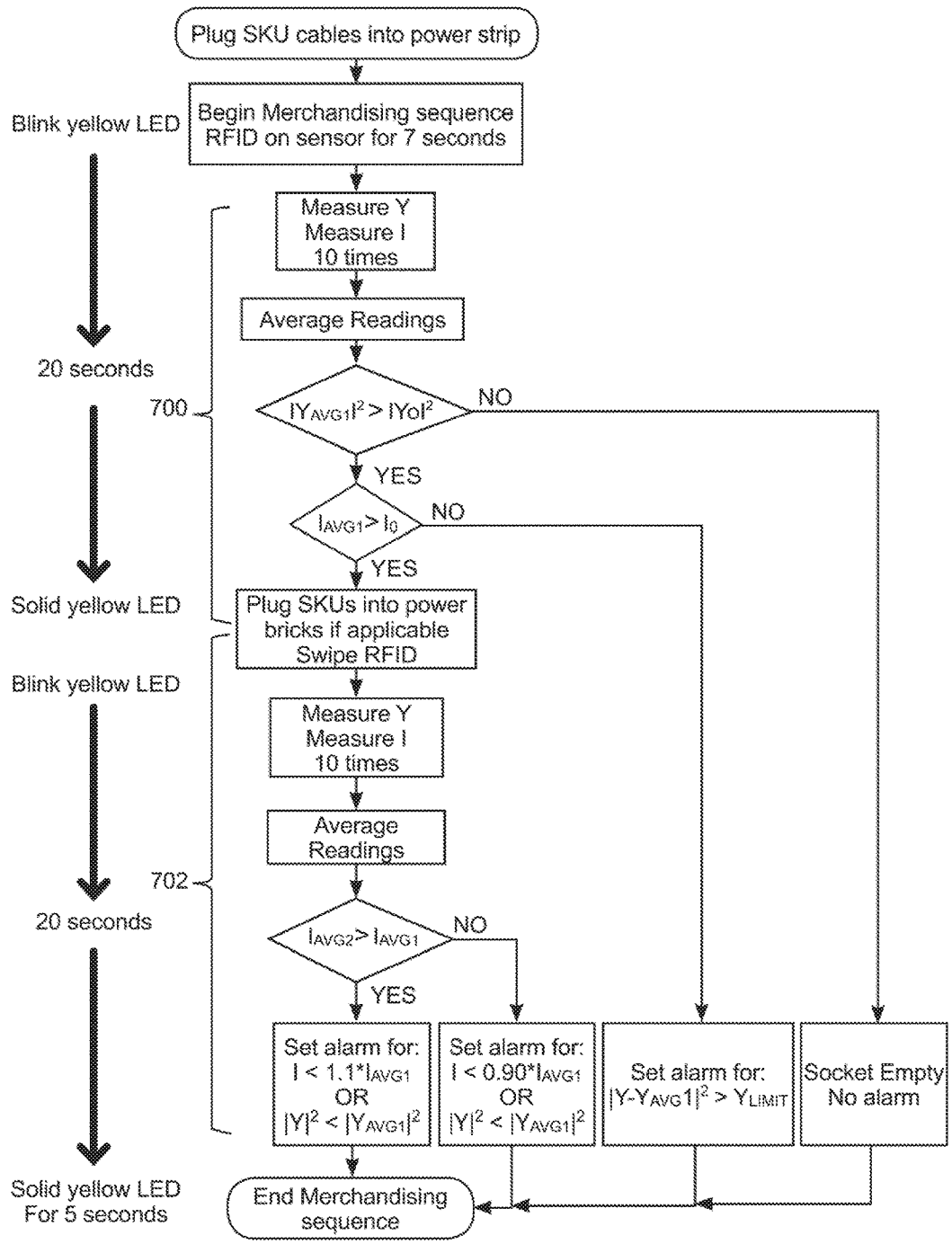
FIG. 7 shows another example calibration process flow.

FIG. 7 shows another example calibration process flow that includes a first calibration phase 700 and a second calibration phase 702.

The process flow can begin when a user plugs an electrical appliance (which can be referred to as a SKU) into a socket 102. If the SKU is a cabled device, the SKU is preferably switched to be in an unpowered state during the calibration process so that the calibrated power strip 100 can be insensitive to variations in characteristics such as current draw that may be experienced by a powered device. Also, if the subject SKU connects to socket 102 via an in-line power transformer such as a charger or a power brick, this step can include detaching the device from the in-line power transformer such that only the in-line power transformer is connected to socket 102.

The calibration process then begins, which can be triggered by user input (e.g., a user using a security fob or the like with interface 130 such as an RFID sensor to be authenticated as an authorized user). As part of the first calibration phase 700, the power strip 100 can measure the admittance (Y) and current draw (I) characteristics through the subject socket 102 a plurality of times (e.g., 10 times), and these measurements can be averaged together. As shown by FIG. 1C, sensor circuit 110 and FPGA 114 can support these operations.

The process flow can then perform Tests A and B as noted in the table above. These tests can be performed by processor 120. Test A can resolve whether the socket 102 is empty. In the example of FIG. 7, Test B can categorize as between (1) either a cabled device with an active standby mode or a regular power brick, and (2) a cabled device with no active standby mode.

For Phase 2 calibration 702, the user can plug a SKU into a power brick connected to the socket 102 (if applicable). Then, the measurement and averaging steps are repeated. The processor 120 can then perform Test C, where the outcome of Test C helps categorize as between a cabled device with an active standby mode and a regular power brick. The alarm limits can then be set in response to these categorizations. It is worth noting that FIG. 7 shows an example calibration process flow where the processor need not perform an explicit categorization step, and the categorization is instead implied by virtue of the logical branching from the outcomes of the various tests.

Figure 8:
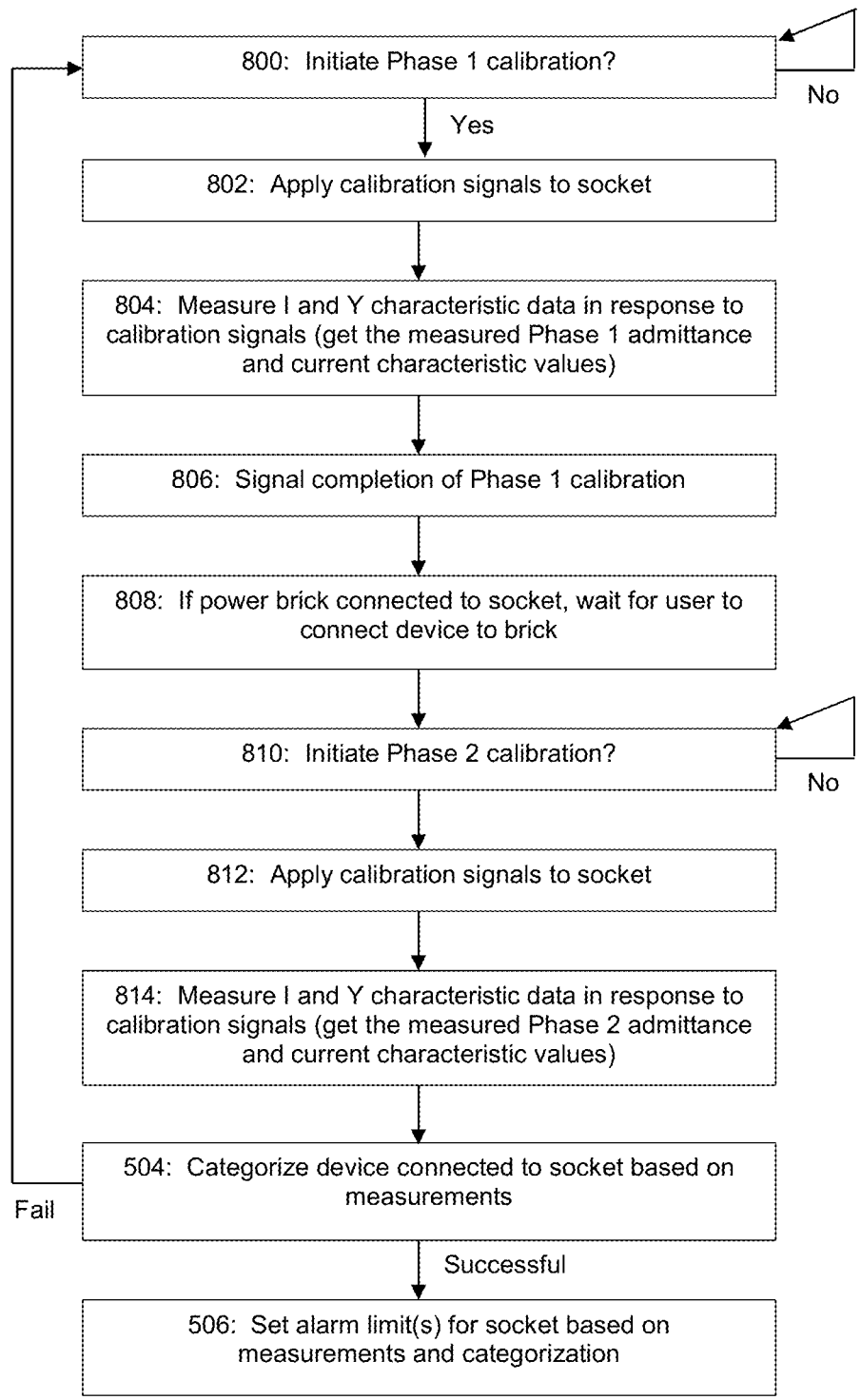
FIG. 8 shows another example calibration process flow.

FIG. 8 shows another example calibration process flow with a focus on user interface features. At step 800, Phase 1 calibration is initiated. This can be accomplished in any of a number of ways. For example, the user can use an authorized security fob to be authenticated and initiate the calibration process. As another example, a calibration command could be wirelessly transmitted to the strip 100 via a remote computer system in response to a request from an authorized user via a user interface. As yet another example, the Phase 1 calibration can be automatically initiated upon detection of a plug event in socket 102 (see Test A discussed above).

At step 802, stimulation signals are applied to the socket 102. As noted above, this step can involve the strip 100 applying multiple admittance and current draw stimulation signals to the socket 102 to trigger various electrical responses from whatever is connected to the socket 102. At step 804, the electrical responses to these stimulation signals are measured by sensor circuit 110 and DSP 114 in order to obtain the Phase 1 admittance characteristic value (e.g., Yavg1) and the Phase 1 current characteristic value (e.g., Iavg1). At this point, the power strip 100 can signal a completion of the Phase 1 calibration to the user (step 806). For example, one or more status indicators 134 can be activated to signal completion of Phase 1 of calibration.

At this point, if a power brick is connected to the socket 102, the user will connect the device that is to be secured to the connected power brick (step 808). Then, at step 810, Phase 2 calibration is initiated. This can be accomplished in any of a number of ways. For example, the user can use an authorized security fob to be authenticated and initiate the Phase 2 calibration process. As another example, a Phase 2 calibration command could be wirelessly transmitted to the strip 100 via a remote computer system in response to a request from an authorized user via a user interface. As yet another example, the Phase 2 calibration can be automatically initiated upon an arming request from an authorized user.

At this point, stimulation signals are again applied to the socket 102 (step 812). These can be the same stimulation signals that were applied at step 802. At step 814, the electrical responses to these stimulation signals are measured by sensor circuit 110 and DSP 114 in order to obtain the Phase 2 admittance characteristic value (e.g., Yavg2) and the Phase 2 current characteristic value (e.g., Iavg2).

Then, at step 504, the system attempts to categorize the device connected to the socket based on the measurements from steps 804 and 814 as discussed above. If categorization is successful, then the appropriate alarm limit(s) for the socket 102 can be defined at step 506 based on the measurements and categorization. If the categorization fails for some reason, then the process flow can return to step 800. Status indicator(s) 134 can be used to signal whether the calibration and categorization were successful.

Figure 9:
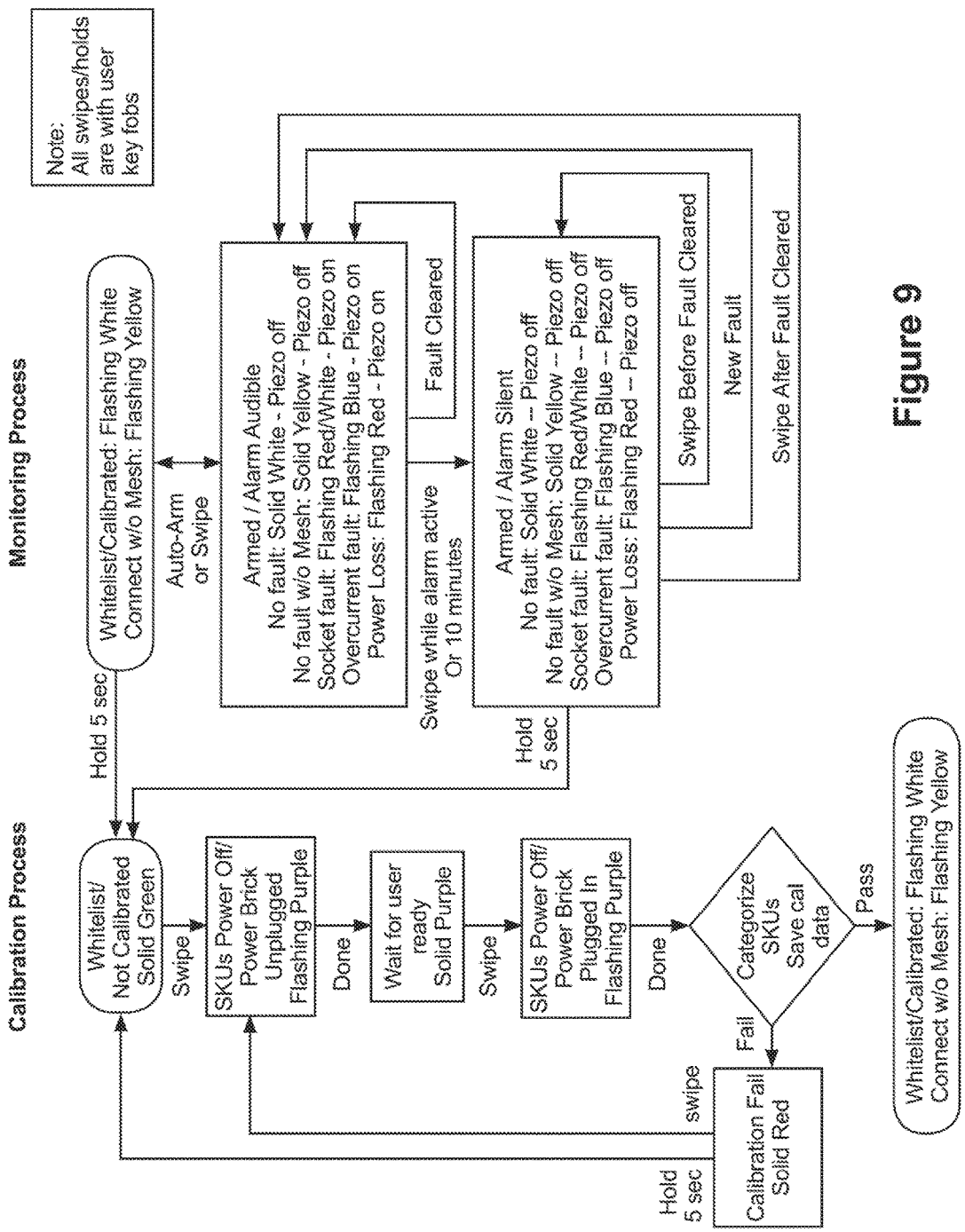
FIG. 9 shows an example calibration and monitoring process flow.

Monitoring:

Once the calibrated alarm limits are set, the system can be armed and it can then continuously monitor the sockets 102 that had devices present at the time they were calibrated. An audible and/or visible alarm may be generated if the alarm conditions set for that socket 102 are met. The power strip 100 can be configured to generate alarms on socket fault, system over current, or loss of main power. Each alarm condition can be a unique signature (e.g., a different sound via piezo element 132 or a different visual indicator via status indicators 134). The power strip 100 can also be controllable to switch between an armed state where monitoring to test for security conditions is performed and a disarmed state where devices can be disconnected from sockets 102 without triggering an alarm. As noted above, interface 130, which may take the form of an RFID sensor, can be used to receive user credentials for authentication to control such arming/disarming operations (as well as silencing alarms if necessary). User authentication via interface 130 can also be used to initiate a calibration sequence in the event the security strip is re-merchandised (e.g. new or different appliances are added to sockets 102). FIG. 9 shows an example process flow for execution by processor 120 with respect to calibration and monitoring phases of operation.

The calibration process of FIG. 9 can proceed in a fashion similar to that shown by FIG. 8. The calibration can be performed on a socket-by-socket basis for the power strip 100, and the alarm limits for each socket can be stored in memory for testing during the monitoring phase to determine whether an alarm should be triggered. If the second calibration phase results in successful calibration of the sockets 102, the status indicator 134 can transition to a particular color (e.g., flashing white) to signal that the strip 100 is calibrated and ready to be armed. The power strip 100 can be configured to auto-arm at this stage, or it could require further user input to arm (such as by swiping the security fob near interface 130). Once armed, the status indicator 134 can once again change (e.g., present a solid white color).

Also, if a user wants to change a SKU that is connected to a socket 102, a remerchandising work flow can be followed. To remerchandise a strip 100, a user can disarm the strip 100 by swiping his or her security fob near the interface 130 while the strip 100 is in an armed state. Upon authentication of the user, the status indicator 134 can transition to a new color (e.g., flashing white) to show the strip 100 as being in a disarmed state. If a device is disconnected from a calibrated socket 102 when the strip 100 is disarmed, the system can forget the settings for that socket 102 in an example embodiment. Also, in an example embodiment, once disarmed, the user can hold the security fob near interface 130 for a defined duration (e.g., 5 seconds) to put the strip 100 into the whitelist/not calibrated state. If the strip 100 is configured to detect removals of a SKU when in the disarmed state, the calibration process can be limited to any sockets 102 that have newly added SKUs. For any sockets 102 with unchanged SKUs, the strip 100 can store a profile of the alarm thresholds for that SKU and re-apply them when the strip 102 is re-calibrated without necessarily having to go through the full calibration flow for such sockets 102.

When the strip 100 is in an armed state, it can repeatedly check the electrical characteristics of the calibrated sockets to determine whether an alarm condition is present. To do so, the strip can apply the stimulation signals discussed above to each calibrated socket 102, and then measure the electrical responses to these stimulation signals to get the newly measured admittance and current draw characteristic values using the same techniques discussed above for the calibration process. These measured values can be referred to as Y and I values. These Y and I values can then be compared against the defined alarm limits for each socket (e.g., see the alarm limits defined at steps 570, 572, 574, and 576 of FIG. 5B).

Thus, the table below can show the situations where various categories of devices will trigger alarms.

TABLE 3

Alarm Testing

| Category | Alarm Test | Alarm Outcome |
| --- | --- | --- |
| Regular Power Brick (with Connected Device) | Is I < 1.1 * Iavg1? OR Is $\|Y\|^2 < \|Yavg1\|^2$? | If either is TRUE, then trigger alarm. If both are FALSE, then no alarm. |
| Cabled Device with Active Standby Mode | Is I < 0.9 * Iavg1? OR | If either is TRUE, then trigger alarm. |

TABLE 3-continued

Alarm Testing

| Category | Alarm Test | Alarm Outcome |
| --- | --- | --- |
| | Is $\|Y\|^2 < \|Yavg1\|^2$? | If both are FALSE, then no alarm. |
| Lite Power Brick (with Connected Device) | Is I < I0? OR Is $\|Y\|^2 < \|Yavg1\|^2$? | If either is TRUE, then trigger alarm. If both are FALSE, then no alarm. |
| Cabled Device with no Active Standby Mode | Is $\|Y\|^2 < \|Yavg1\|^2$? | If TRUE, then trigger alarm. If FALSE, then no alarm. |

It should be understood that these alarm tests are examples, and alternative metrics can be used to test for the respective conditions. For example, the admittance-based alarm tests can include a measurement noise tolerance if desired by a practitioner where the decrease in admittance needs to exceed a defined threshold (Ylim or Ylimit). In such an example, the system can trigger an alarm if the square of the difference between Y and Yavg1 exceeds Ylim. These Ylim values could then vary based on device categorization if desired by a practitioner.

As noted above, if the processor 120 concludes that any of the sockets 102 of the strip 100 are in an alarm condition, signals can be provided to piezo element 132 and/or status indicators 134 to signal the alarm condition to users. Similarly, if the strip 100 supports wireless communications, an alarm notification message can be wirelessly transmitted to a remote computer system. Furthermore, the alarm signals and notifications can be socket-specific if desired by a practitioner.

If the strip 100 is in an alarming state, a swipe of a security fob by a whitelisted user can silence the alarm on the strip 100 (e.g., silence piezo element 132), but the status indicator 134 may continue to flash to signify the alarm state (e.g., flashing red and white). If the strip 100 is in a silent alarm mode, the strip 100 can be configured to maintain the security of unaffected sockets 102 such that the detection of a subsequent security event at an unaffected socket 102 will trigger an audible alarm to provide a notification that another socket 102 has been compromised. After the strip 100 goes into a silent alarm mode, a subsequent swipe of the security fob by a whitelisted user can trigger an attempt to re-arm the strip. As part of this re-arming, if the affected socket 102 that was compromised has been re-connected with the same SKU, then the strip 100 can be configured to self-heal and automatically re-arm. If the compromised socket 102 is still registering the same fault condition, then the strip 100 can remain in the silent alarm mode with the status indicator 134 flashing red and white.

The strip 100 can also provide a process flow for overcurrent situations. This process flow can provide an overcurrent breaker with a status indicator that indicates a condition via a state such as flashing blue and an audible signal such as an alert tone of sounds (such as 10 double beeps, followed by a brief off period, followed by 10 double beeps, etc.) that continues for a specified duration (e.g., 10 minutes). During an overcurrent situation, the strip 100 can power the audible signal and status indicators from an internal battery (e.g., battery 140). In this overcurrent mode, a user can silence the alarm with a swipe of a security fob near interface 130, but this action would not clear the overcurrent condition. While in this overcurrent mode, the sockets 102 can remain secured such that the unplugging of a SKU would trigger an alarm. To do so, socket power can be shut off, but the sensor circuits 110 and monitoring circuitry could remain connected to the wall power (or powered from battery 140 if necessary). Once the overcurrent situation is cleared, the strip 100 can return to mains power and operate as normal. The battery 140 can be used to drive the strip 100 in an alarm state for a duration of time deemed necessary for allowing an overcurrent situation to be cleared without an undue risk of battery drainage that would leave the strip 100 in an unsecured state. Calibration values of sockets 102 can be stored in non-volatile RAM so that they can be recovered in the event of brief power losses. Furthermore, in the event of mains power loss for an armed strip 100, the loss of mains power can trigger the alarm state (run from battery 140).

Additional Example Features

Figure 10:
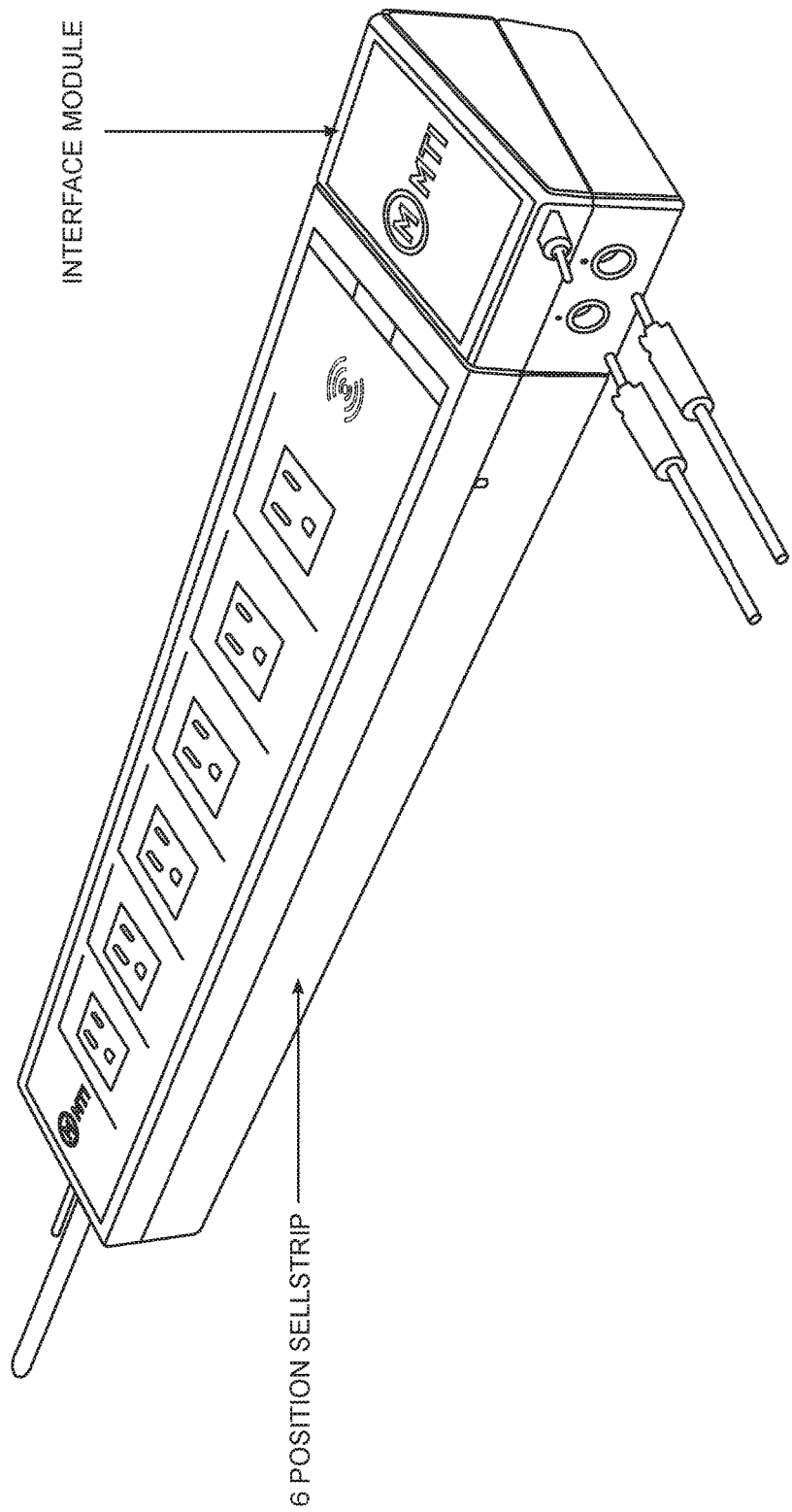
FIG. 10 shows an example perspective view of a power strip connected with an expansion module according to an example embodiment.

FIG. 10 shows a general perspective view of an example intelligent power strip. The power strip of FIGS. 1A, 1B, and 10 may be made from a polymer material such as a plastic. Components of the power strip may be molded and assembled together to form the complete power strip. As noted, the sockets of the power strip may be molded to fit any number of outlet configurations based on the requirements of the power cord for the electronic appliance. In some embodiments, like those viewed in FIG. 1A, the sockets may be a type B socket providing 120V, a type G socket providing 220V, or a type F socket providing 220V. As voltage requirements and socket configurations/shapes are usually geographically determined, the top cover of the power strip may be molded to accommodate the socket configurations/shapes of the location where the power strip is implemented. The top cover can be further interchangeable with the bottom cover of the power strip. Therefore, a new or different socket configuration top cover may be placed upon an existing power strip if the power strip is moved to a region that uses a socket configuration.

The top cover of the power strip may also have a user interaction location identified on the top cover. The user interaction location in some embodiments may an RFID icon or the like notifying a user where the internal circuitry for an RFID reader is located. A user using an acceptable RFID device (i.e. badge, card, fob, or the like) may place the RFID device in proximity to the user access location to facilitate actions of the power strip. As noted above, these actions may include arming or disarming actions of the attached electronic appliances so that a user may freely attach and remove electronic appliances from the power strip. A status indicator such as an LED may also be located near a second longitudinal end of the power strip. The LED provides the user a visual status of the power strip. In some embodiments, the LED may emit a colored illumination based on the status of the power strip. These statuses may include but are not limited to indications or the power strip being armed, the power strip being disarmed, or the power strip acting in an alarming mode.

In the view of FIGS. 1A, 1B, and 10, the top cover can be viewed to have an angled configuration rising from a front side to a rear side of the power strip. Also on a front side near the second longitudinal end, a sound hole may be present for an internal alarm such as a piezo alarm. The internal alarm may have a speaker facing the sound hole to allow sound to travel outside the power strip so that a user may audibly hear the alarmed state of the power strip.

Viewing the bottom cover of the power strip (see FIG. 1B), a plurality of fastening points may be seen. These fastening point may be located on the edges of the bottom cover to attach components of the power strip together to form the assembly. The plurality of fastening points may provide apertures to accept fasteners such as screws or the like to complete the assembly. The bottom cover of the power strip may also contain a plurality of adhesive areas. Within these area, an adhesive or adhesive pad may be placed on the power strip so that the power strip can be attached to hidden locations such as a wall or beneath a table in a retail environment in an attempt to obstruct a customer's view of the power strip.

The first longitudinal end of the power strip may contain a power cord exit. The power cord exit may house a power cord attachable to an outside socket to provide main power to the power strip. The second longitudinal end of the power strip may have an encapsulating design.

Also seen in FIG. 10 is an example expansion module which may be added and in electronic connection with the power strip. The expansion module can support external peripherals and the daisy chaining of multiple power strips. Circuitry within the power strip itself can be configured to operate referenced to the main power. An isolated communication bus (see 138 in FIG. 1C) can be included in the design such that an expansion module can be attached. In example embodiments, use of an isolated communications bus may permit a number of pieces of electronic equipment, such as external peripherals, for example, to be arranged serially, for example, or in parallel, in a "connected store" architecture. In such an architecture, at least in example embodiments, unauthorized removal of electronic equipment, for example, may bring about triggering of an alarm, or other form of signal to identify, for example, to store personnel, that the piece of electronic equipment has been tampered or is the subject of an attempt for unauthorized removal. In some embodiments, the expansion module has the ability to control the power strip through a UART connection. The expansion module may include a remote RFID module and/or a remote piezo alarm speaker. Additional embodiments may include network and/or RF mesh network connectivity for higher level monitoring and/or control of the security strip.

A raised ledge around the power strip may circumnavigate the second longitudinal end providing a slight recessed area where the expansion module may be positioned to be flush against the second longitudinal end. The second longitudinal end of the power strip may also contain a contact pad. This contact pad may include a plurality of contacts so that the power strip may connect with the expansion module in some embodiments. The plurality of contacts within the contact pad may be spring contacts which connect to corresponding contacts of the expansion module. To facilitate positioning and secure attachment of the expansion module to the power strip, a plurality of magnets may be located within the interior of the power strip and face the second longitudinal end. When the expansion module is inserted into the recess, the plurality of magnets attach to corresponding magnets in the expansion module to secure connection of the expansion module as well as securing contact of the power strip contact pad to the corresponding contacts of the expansion module.

Figure 11:
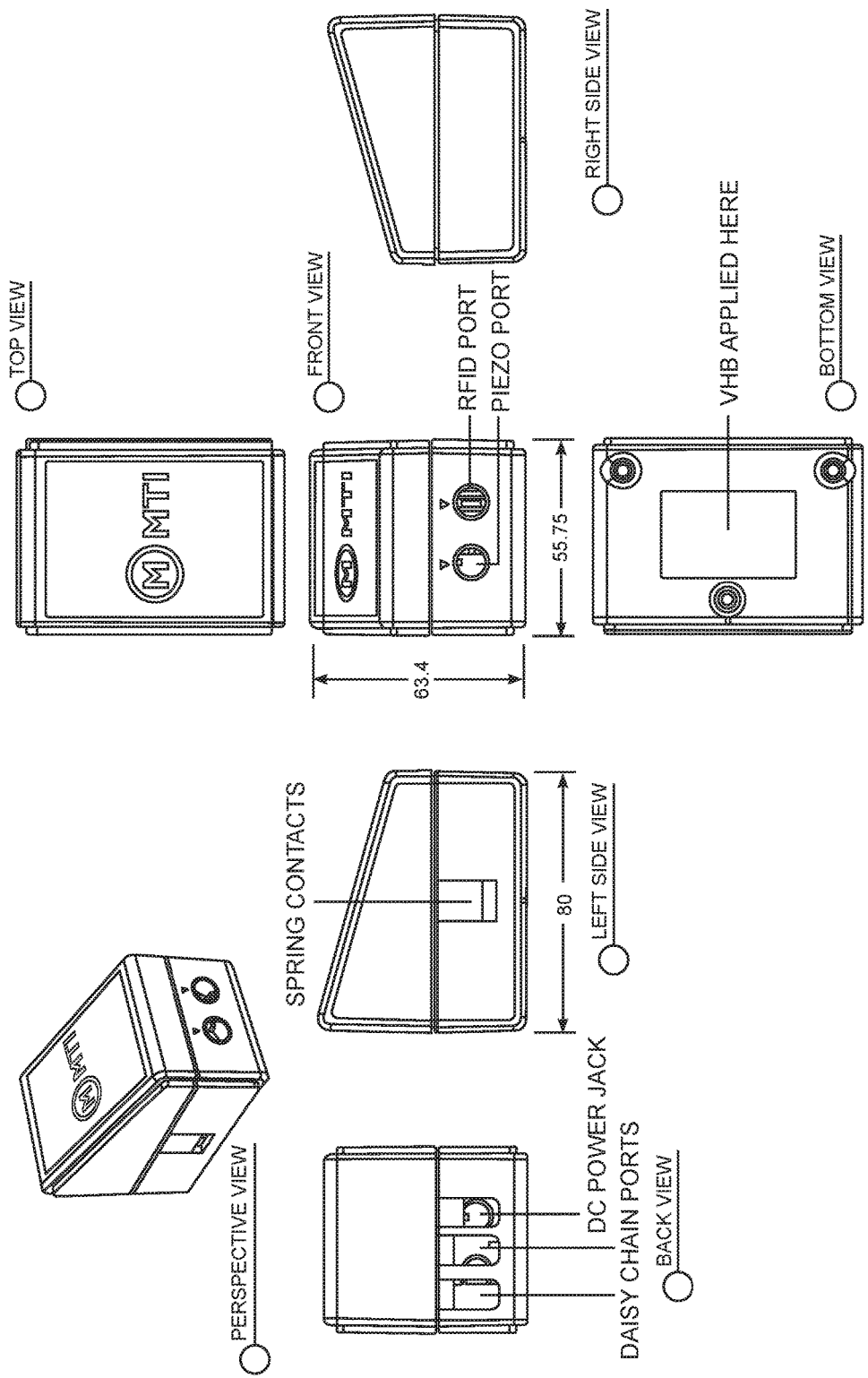
FIG. 11 show multiple examples of perspective views of an expansion module according to an example embodiment.

FIG. 11 shows multiple perspective views of an example expansion module. The expansion module of FIG. 11 may be an assembly that includes a top cover and a bottom cover that are shaped in a manner consistent with the power strip. Like the power strip, the expansion module may be formed from a polymer material such as a plastic. The top cover of the expansion module may have an angled configuration so that when attached to the power strip, the assembly of the power strip and the expansion module together forms a uniform design. The first end view of the expansion module shows the expansion module contacts. Similar to the contact pad of the power strip, the expansion module contacts may be a plurality of contacts such as spring contacts. When the expansion module is connected with the power strip, the expansion module contacts contact the contact pad of the power strip to facilitate electronic communication between the two units. In this manner, devices attached to the expansion module can also be controlled by the alarming functionality of the power strip. The first end view of the expansion module shows a tiered view of the surface area of the first end. A risen tier provides a majority of the surface area of the first end where a lowered edge tier circumnavigates the edge of the first end. When the expansion module is placed in contact with the power strip, the risen tier fits within the recess of the second longitudinal end of the power strip while the lowered edge tier contacts the raised edge of the power strip. This helps secure the expansion module into the power strip and provides a visual uniform design. Also located within the expansion module are a plurality of expansion module magnets positioned near the first end to attached to the plurality of magnets of the power strip. This connection by magnetic force helps secure placement of the expansion module and the power strip together.

A front side of the expansion module may contain a plurality of front input ports. These front input ports are used so that outside components can connect to the expansion module to help control and execute the alarming features of both electrical appliances attached to the expansion module and electronic appliances attached to the power strip. The front input ports may each, in some embodiments, have raised notches internal to the port to facilitate the attachment of specific external devices. The internal raised notches ensure that only proper electronic components are attached to the expansion module which may communicate with the power strip based on the connective circuitry between the expansion module and the power strip.

One front input may provide a connection to a remote interface such as an RFID reader (see RFID port in FIG. 11). In this manner, an RFID reader can be positioned remotely from the power strip and connect with the strip via a cable inserted into the RFID port. Thus, the power strip can be positioned on the floor or underneath a display position such as a table or shelf while the external RFID reader can be positioned in a location that is more easily accessible by a user. A user using an acceptable RFID device (i.e. badge, card, fob, or the like) may place the RFID device in proximity to the external RFID reading device to facilitate actions of the power strip or to control electronic appliances attached to the expansion module. These actions may include arming or disarming actions of the attached electronic appliances so that a user may freely attach and remove electronic appliances from the power strip or the expansion module.

Another front input of the expansion module may be an alarming port (e.g., see piezo port in FIG. 11). The alarming port may connect an external piezo element such as an alarming buzzer to the expansion module. The alarming buzzer may activate when the power strip is in an alarming state and produce audible noise to notify the user of the current alarm condition.

A back side of the expansion module may contain a plurality of daisy chain ports as well as a power port. The power port may connect a direct current to the expansion module to power components, including those connected by the daisy chain ports, such as those connected to the RFID port and/or alarming port of the expansion module. The expansion module contains its own separate power port so that electrical interference between the power strip and the expansion module can be minimized by removing the need to transmit power through the contacts of both the power strip and expansion module. The power port in one embodiment is envisioned to apply direct current into the expansion module, but alternating current power may be providing with rectifying circuitry within the expansion module if desired. In example embodiments, a power brick with an adapter can be connected to the main power and supplied to the power port.

The plurality of daisy chain ports allow for additional electronic appliances and even additional power strips to connect to the expansion module. In this manner, the original power strip may contain the functional alarming conditions for all of the attached electronic appliances, including additional power strips, through the expansion module. The daisy chain ports may be RJ11 connectors.

Viewing the bottom cover of the expansion module as shown by FIG. 11, a plurality of expansion fastening points are seen. These expansion fastening points may be located on the edges of the bottom cover to attach the top cover of the expansion module together to form the assembly. The plurality of expansion fastening points may provide apertures to accept fasteners such as screws or the like to complete the assembly. The bottom cover of the expansion module may also contain an expansion adhesive area. In this area, an adhesive or adhesive pad may be placed on the expansion module so that the expansion module may be connectably located near the power strip and attached to a precise location such as a wall or beneath a table in a retail environment in an attempt to hide or obstruct a customer's view of the expansion module and power strip combination.

Figure 12:
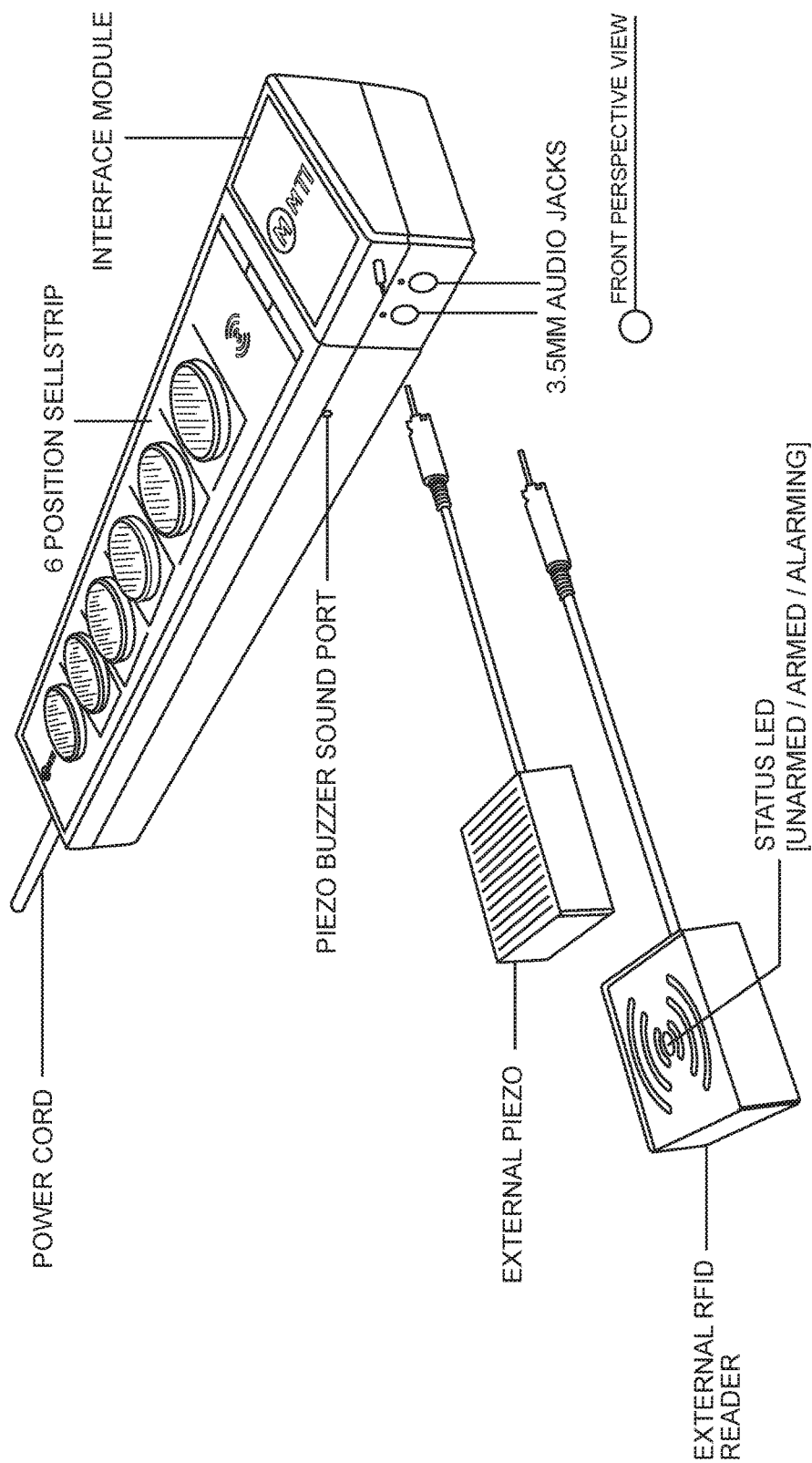
FIG. 12 is an example perspective view of the power strip connected to the expansion module with external appliances lined up to be connected to the front input ports of the expansion module according to an example embodiment.

FIG. 12 shows a complete view of the power strip attached to an expansion module with external appliances lined up to be connected to the front input ports of the expansion module. As stated above, these external appliances may be an alarming buzzer and a RFID reader although other components and devices may attached to the these front input ports. The connectors of each the alarming buzzer and the RFID reader may have a unique configuration including traversing channels in both the latitudinal and longitudinal directions which may fit into the raised notches of their corresponding front input ports to ensure that the correct external device is connected to the correct front input port. Once inserted into the correct front input port, the respective connector may be rotated approximately ninety degrees to lock the connecter by use of the latitudinal channel to secure the connector to the front input port. Cords of varying lengths can used to connect the expansion module to the respective external appliance. The underside of both the RFID reader and the alarming buzzer (not shown) may contain an external device adhesive area. In this area, an adhesive or adhesive pad may be placed on the external appliance so that the external appliances may be located remote from the power strip and expansion module assembly. Screw mounts may also be located on these external appliances to place them in remote locations. Possible remote locations include walls or on a top surface of a retail table so that store employees and customers can both access and be aware of these external appliances and their security purpose.

Figure 13:
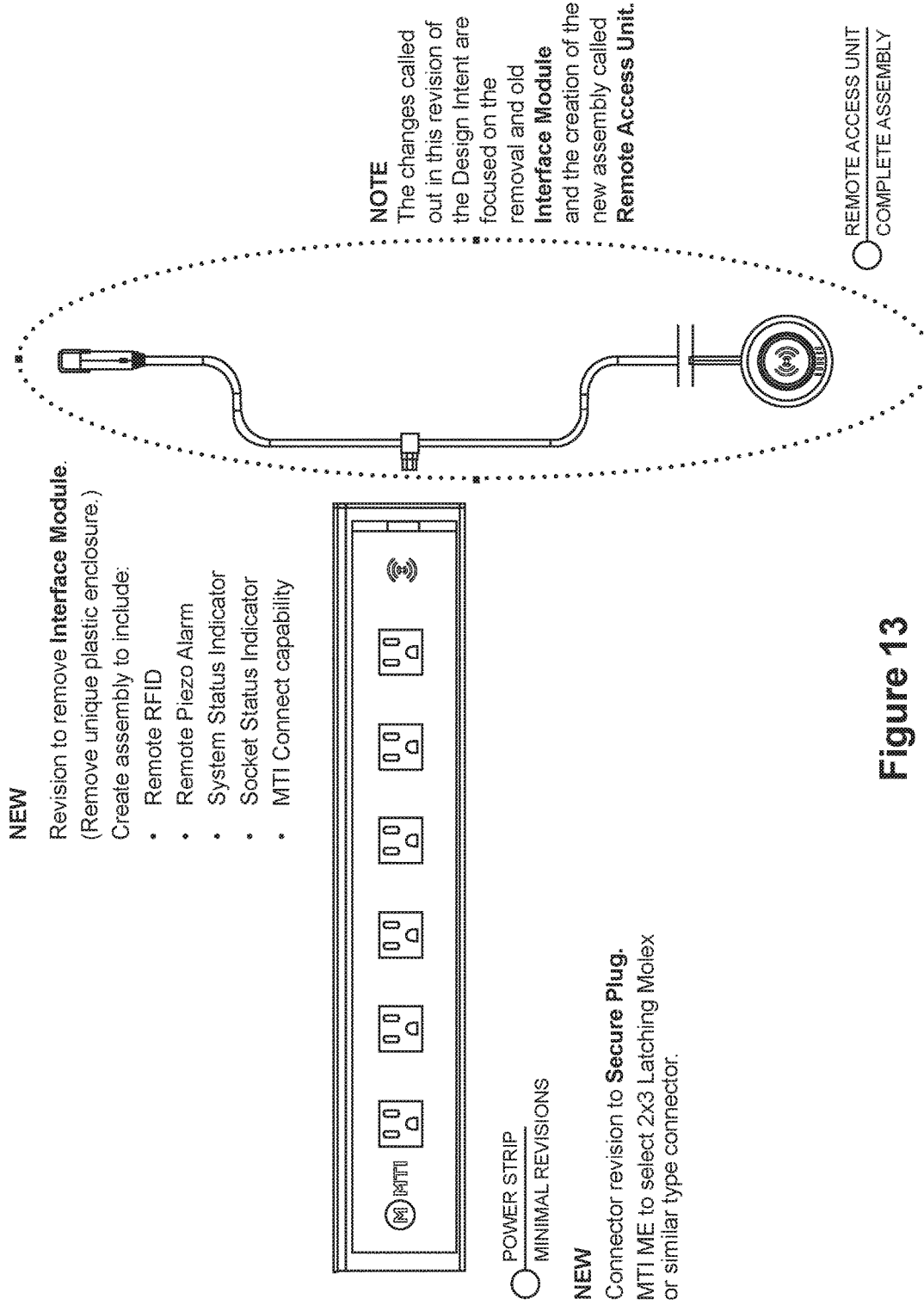
FIG. 13 shows another example embodiment of an expansion module arranged as a remote access unit according to an example embodiment.

FIG. 13 shows an alternate embodiment of the power strip and expansion module. In this example embodiment, the expansion module is configured as a remote access unit with a different shape and connection configuration than the expansion module of FIGS. 10-12. The nature of the interface between the power strip and the expansion module of FIG. 13 can be changed relative to the interface used by FIGS. 10-12. For example, a latching connector could be used to connect the expansion module of FIG. 13 with the power strip. The latching connecter may have a 2×3 pin design and may be a latching Molex connector. A remote access unit plug may then fit into the latching connector securing the remote access unit to the power strip for electronic communication between the remote access unit and the power strip.

Figure 14:
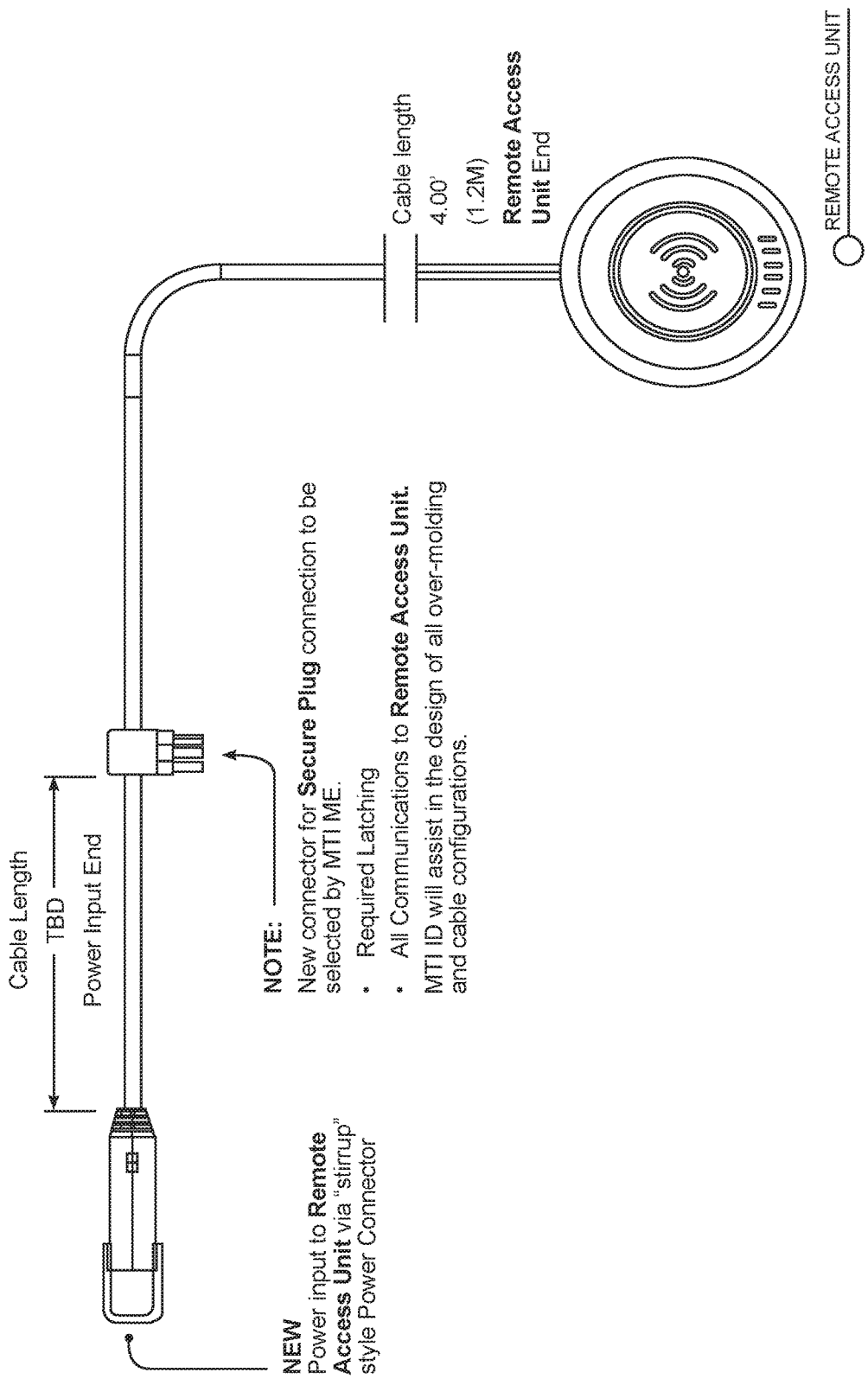
FIG. 14 shows a standalone view of an example remote access unit according to an example embodiment.

FIG. 14 shows a standalone view of an example remote access unit. A remote access unit plug may contain the same 2×3 pin design so that it can be inserted into the latching connector of the power strip. On one end of the remote access unit plug, a cord connects the remote access unit plug to a power connector. The cord may vary in length based on the intended use and conditions of the retail environment. The power connector may have a stirrup design and connect to either a DC or AC power source to power the remote access unit. Doing so, electrical interference between the power strip and the remote access unit is minimized by removing the need to transmit power through the latched connector and plug combination. The power port in one embodiment is envisioned to apply direct current into the remote access unit, but alternating current power may be provided with rectifying circuitry within the remote access unit. In an example embodiments, a power brick with an adapter can be connected to the main power and supplied to the power connector. However, in other example embodiments, the remote access unit can be powered from the power strip 100 via a power signal passed through an interface between the remote access unit and power strip 100.

On the other side of the remote access unit plug, a second cord can be present which connects the plug to the remote access unit. The cord may vary in length based on the intended use and conditions of the retail environment. The remote access unit can terminate in components such as an RFID reader and alarming unit such as noted above in connection with the expansion module of FIGS. 10-12. Additionally, other connectivity and notification components may be included within this embodiment of the remote access unit.

Figure 15:
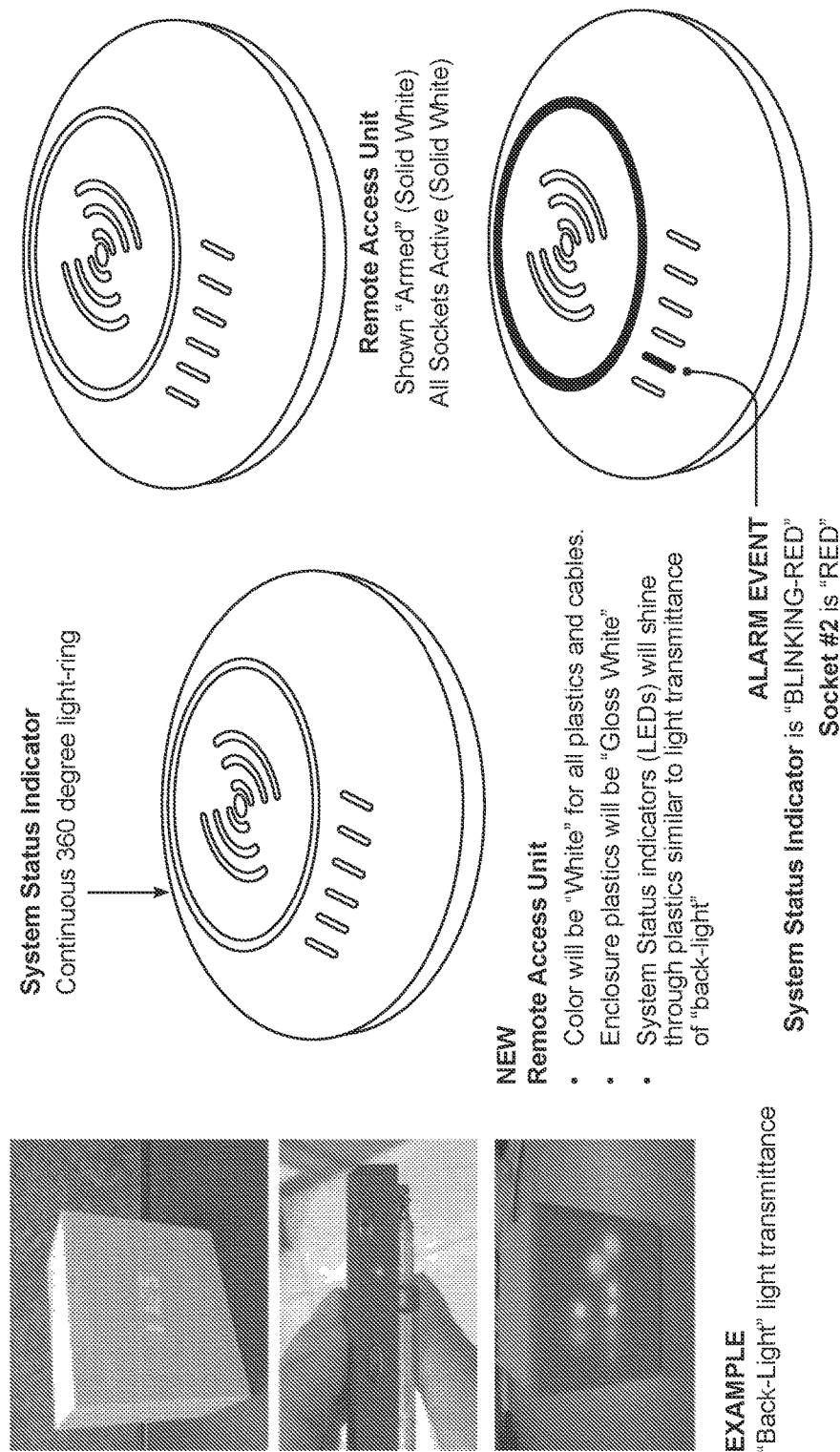
FIG. 15 is a perspective view of an example remote access unit showing a notification functionality according to an example embodiment.

As viewed in FIG. 15, an example alarming/status indicator portion of a remote access unit is shown in greater detail. The remote access unit portion shown by FIG. 15 can include an alarming buzzer such as a piezo alarm. The alarming buzzer connects the remote access unit through an internal circuit and electrical communication to the piezo alarm features of the power strip. The alarming buzzer may activate in an alarming state and produce audible noise to notify the user to a current alarming condition of at least one electronic appliance connected to the power strip. For example, during an unauthorized unplugging of an attached electrical appliance from the power strip, the alarming buzzer of the remote access unit may activate so that an audible alarm is heard by store personal indicating a possible issue with the electronic appliance.

The remote access unit portion of FIG. 15 may also include status indicators that operate as described above for status indicators 134. In the example of FIG. 15, the status indicators may take the form of a light ring on a top surface of the remote access unit. The light ring may take a 360° circular pattern on the top surface. The light ring may illuminate by a plurality of LEDs in a color scheme based on a state of the power strip. If, for example, the color scheme is green, the light ring may indicate that the power strip is deactivated so that a store employee can attached or disconnect electronic appliances from the power strip without activating an alarm. If, for example, the color scheme is white, the light ring may indicate that the power strip is active and armed so that unauthorized removal of the attached electronic appliances will cause the power strip to enter and alarming state. Also, for example, if the color scheme is red, the light ring may indicate that the power strip is currently in an alarming state such that there is at least one issue with either the power strip or the attachment of electronic appliances to the power strip. The light ring provides store employees and users an easy visual indication as to the status of the power strip. Due to its attachment remote from the power strip via the cord, the remote access unit may be placed in locations for easy access and viewing by store employees.

The remote access unit portion shown by FIG. 15 may also have a plurality of socket indicators on the top surface of the remote access unit. The plurality of socket indicators may illuminate in a color scheme based on the status of a particular socket of the power strip. For example, in an embodiment, the power strip may have six sockets with each socket attached to a different electronic appliance. Just as the light ring visually indicates the status of the overall power strip, the plurality of socket indicators may illuminate to show the socket where a particular event is occurring. For example, during an alarming event, the color scheme of the light ring of the remote access unit may be red. Additionally, the particular socket indicator of the plurality of socket indicators may also illuminate in a red color to notify a store employee or user that the electronic appliance attached to that particular socket is the source of the alarming event. The plurality of socket indicators further allows store employees and users the ability to localize and identify issues with the power strip during alarming states, disarming states, or armed states. Electrical communications between the remote access unit and the power strip are interpreted to illuminate the plurality of socket indicators accordingly.

The remote access unit may also provide connectivity to an outside remote server. In this regard, the remote access unit may have a network interface such as a wireless transceiver to allow the remote access unit to communicate with both a remote server and/or to the electronic appliances attached to the power strip. In example embodiments, the remote access unit can determine the particular type of electronic appliance connected to each socket of the power strip. The remote access unit may then report through wireless signal transmission back to the remote server the location of each attached electronic appliance in the overall retail store. If an alarming event was to occur, the remote access unit may communicate the alarming state of both the power strip and the attached electronic appliance to the remote server. In such instances, store personnel or security personnel can easily identify the security issue and act accordingly to remedy potential theft situations.

Figure 16:
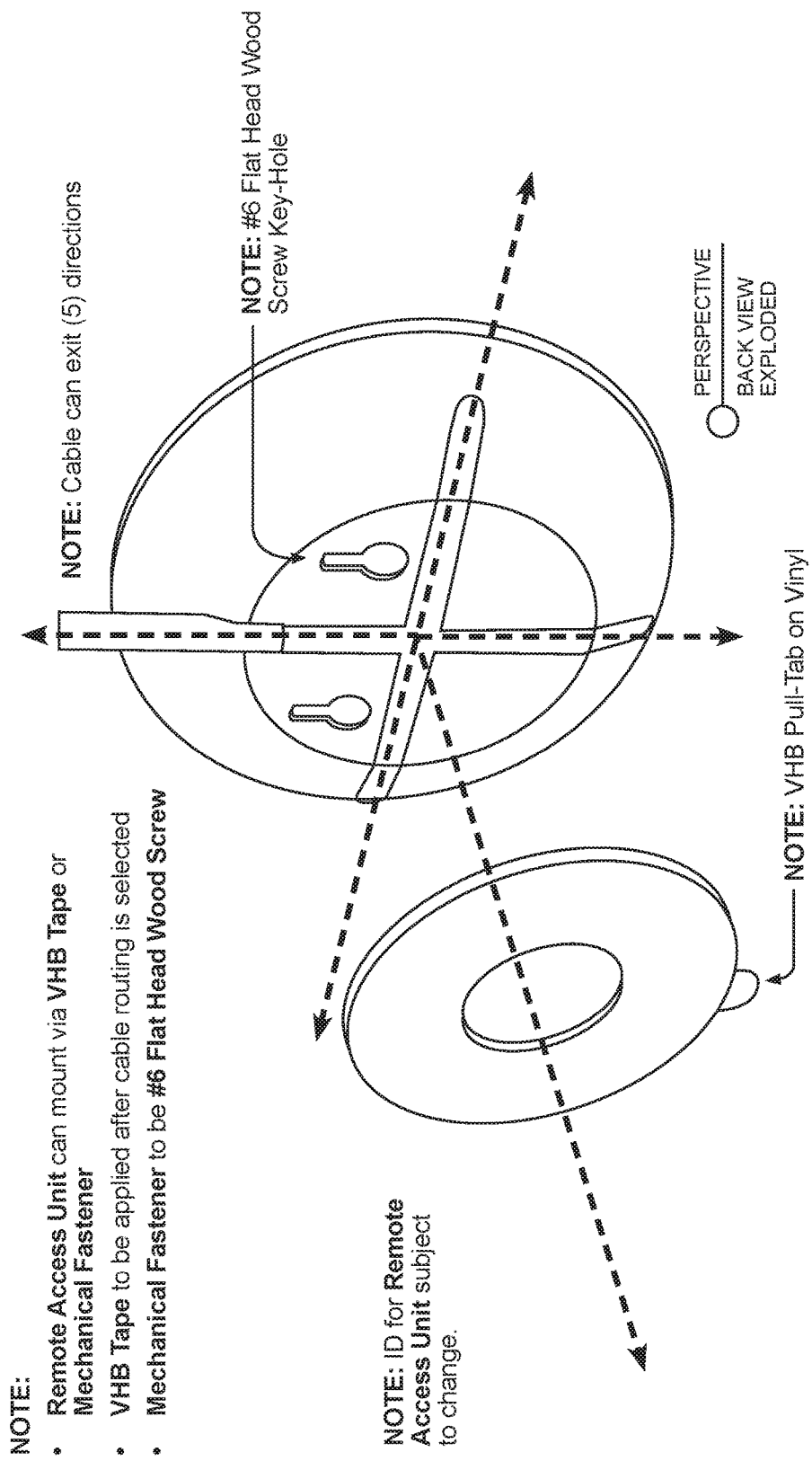
FIG. 16 is a back view of an example remote access unit according to an example embodiment.

FIG. 16 shows a back view of the remote access unit. The remote access unit has a circular design and may be an assembly of component parts manufactured from a polymer material such as plastic. The back surface of the remote access unit may have at least two channels crossed with one another. The channels run perpendicular to one another. Each channel has a depth suitable to fit the cord exiting the middle of the remote access unit. The crossing nature of the channels allows for the cord to be placed in the appropriate location so that the front view of the remote access unit can be positioned based on the needs and use of the store employee or user. A plurality of key hole mount may also be present on the back surface of the remote access unit. The plurality of key hole mounts may affix to a screw to mount the remote access unit on a wall or table. In other embodiments, a remote access unit adhesive area may be present. In this area, an adhesive or adhesive pad may be placed on the back surface of the remote access unit so that the remote access unit may be located away from the power strip. Possible remote locations include walls or on a top surface of a retail table so that store employees and customers can be notified of the visual security settings of the remote access unit as well as maintain accessibility to the features of the remote access unit. Placing the remote access unit away from the power strip also allows the connectivity features of the remote access unit the ability to function without possible inference given off by the power strip's power demands.

Figure 17:
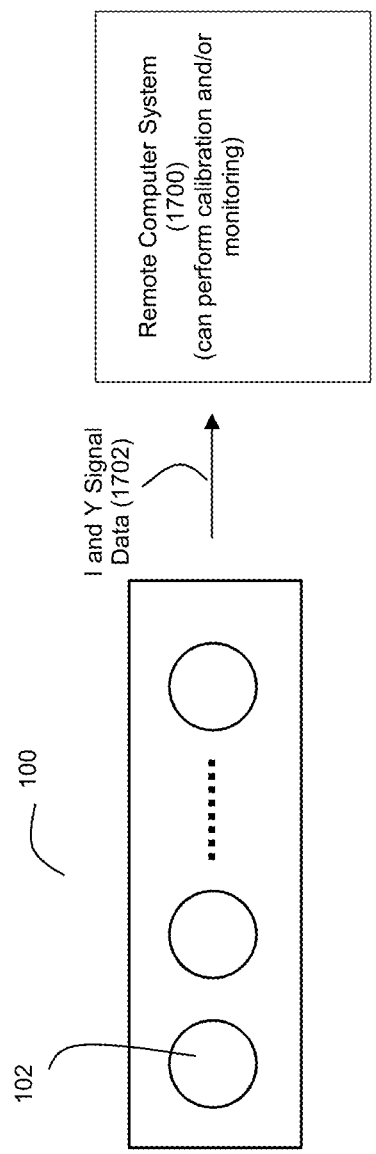
FIG. 17 shows an example embodiment where a power strip offloads calibration and/or monitoring functions to a remote computer system via wireless connectivity with the remote computer system.

FIG. 17 shows another example embodiment where the power strip 100 includes a wireless transceiver that provides connectivity for the power strip 100 with a remote computer system 100 via a wireless network. With such an embodiment, the computational burden of the calibration and/or monitoring operations can be shifted to compute resources within a remote computer system 1700 and out of the power strip 100. This can permit a simplified design for the power strip 100 where the signal data for the monitored electrical characteristics (e.g., admittance and current draw) are wirelessly communicated from the power strip 100 to the remote computer system 1700 (see 1702 in FIG. 17). The remote computer system 1700 can take the form of a server or other network-accessible service (e.g, a cloud service) that can be leveraged by the power strip 1700 to calibrate and/or monitor the sockets 102.

Also, while the example embodiment discussed above describe the powered and alarming system for connection to one or more electrical appliances as being implemented in a power strip, it should be understood that this technology could also be implemented in other types of units.

Figure 18:
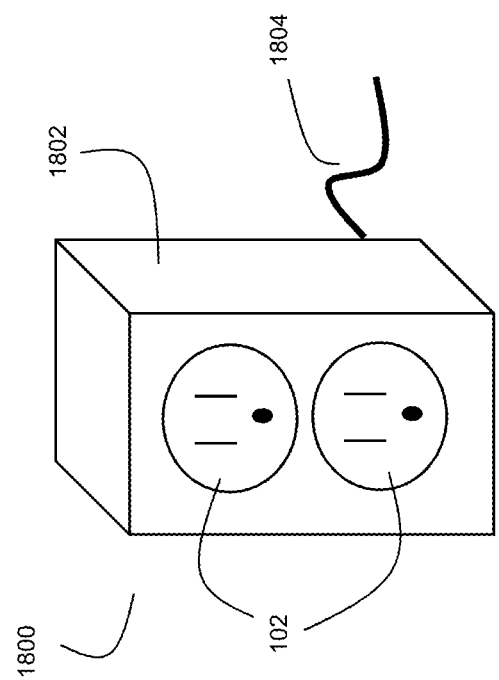
FIG. 18 shows an example embodiment where secured sockets are included as part of a wall outlet.

For example, the socket 102 and associated circuitry can be included as part of a wall outlet or the like to form a "smart" or "intelligent" wall outlet that provides a security function for appliances connected to the socket. An example is shown by FIG. 18. For example, many wall outlets 1800 feature two sockets 102 in a vertical orientation as shown by the example of FIG. 18, where the sockets are part of an electrical receptacle 1802 fitted into a recess of a wall. Wiring 1804 then is run to circuitry in the receptacle 1802 to power sockets 102. Some or all of the circuitry shown by FIG. 1C can be included in a portion of the outlet within the receptacle 1802. Similarly, a wireless transceiver can be included as part of this circuitry to provide wireless connectivity with remote computer systems that can receive alarms and remotely control the socket(s).

As another example, the secured socket 102 can be different socket types such as USB-A sockets, USB-C sockets, RJ-45 sockets, power over Ethernet (PoE) sockets, and others. The calibration and monitoring circuitry discussed herein can be connected to any such socket types to provide a security function for the subject socket.

Thus, a power and/or alarming security system for electrical appliances may provide many benefits. For example, such a system may include multiple alarm points, such as for power plug removal, power brick removal, power adapter plug removal, or the like. A power and/or alarming security system for electrical appliances may also provide, for example, for an easier installation and/or setup, simpler and/or clutter-free solution, merchandising flexibility (e.g., using OEM power cables, etc.), reduced cost solution per position, etc. In some embodiments, an intelligent system may also provide, for example, smart security smart device recognition, self-healing, etc., may detect a number of types of power loss, relatively quickly disarm and/or manage via RFID key system, or the like. Of course, these are merely example benefits of the power and/or alarming security system and other advantages may be realized.

While the invention has been described above in relation to its example embodiments, various modifications may be made thereto that still fall within the invention's scope. Such modifications to the invention will be recognizable upon review of the teachings herein.

What is claimed is:

1. An apparatus comprising:
a socket configured for detachable electrical connection with an electrical appliance; and
a circuit configured to (1) provide power to a connected electrical appliance through the socket, and (2) calibrate an alarm limit for a security function for the socket based on a plurality of electrical characteristics of the connected electrical appliance that are measured via the socket, wherein the electrical characteristics comprise an admittance characteristic and a current draw characteristic of the connected electrical appliance.

2. The apparatus of claim 1 wherein the circuit is configured to calibrate the alarm limit for the socket according to a plurality of calibration phases.

3. The apparatus of claim 2 wherein the calibration phases comprise a first calibration phase and a second calibration phase;
wherein for the first calibration phase, (1) if a power brick is connected to the socket, the electrical appliance is not connected to the power brick, and (2) if the electrical appliance is not connected to the socket via a power brick, the electrical appliance is connected to the socket and is turned off to be in an unpowered state; and
wherein for the second calibration phase, (1) if a power brick is connected to the socket, the electrical appliance is connected to the power brick, and (2) if the electrical appliance is not connected to the socket via a power brick, the electrical appliance is connected to the socket and is turned off to be in an unpowered state.

4. The apparatus of claim 2 wherein the calibrated alarm limit is insensitive to whether the connected electrical appliance is powered.

5. The apparatus of claim 2 wherein the calibrated alarm limit is sensitive to whether electrical appliance is plugged into the socket via a power brick.

6. The apparatus of claim 1 wherein the circuit is further configured to monitor at least one of the admittance characteristic and/or the current draw characteristic of the connected electrical appliance as against the alarm limit to test for an alarm condition.

7. The apparatus of claim 6 wherein the circuit is further configured to (1) measure an admittance characteristic of the connected electrical appliance and a current draw characteristic of the connected electrical appliance through the socket, (2) calibrate an alarm limit with respect to the connected electrical appliance based on the measured admittance characteristic and the measured current draw characteristic, (3) monitor the electrical characteristics of the connected electrical appliance through the socket, (4) compare the monitored electrical characteristics with the calibrated alarm limit to determine whether a security condition exists, and (5) generate a signal indicative of the alarm condition in response to a determination that the security condition exists.

8. The apparatus of claim 7 wherein the circuit is further configured to (1) apply a plurality of different stimulation signals to the connected electrical appliance through the socket, and (2) measure the admittance and current draw characteristics of the connected electrical appliance in response to the different stimulation signals, and (3) define the alarm limit based on the measured admittance and current draw characteristic responses.

9. The apparatus of claim 8 wherein the stimulation signals include a plurality of stimulation signals of different frequencies.

10. The apparatus of claim 7 wherein the circuit comprises a processor configured to perform the compare and generate operations.

11. The apparatus of claim 6 wherein the circuit comprises a current and admittance sensor circuit configured to sense an admittance and a current draw of the connected electrical appliance to support the calibrate and monitor operations.

12. The apparatus of claim 11 wherein the circuit further comprises an analog to digital converter (ADC), the ADC configured to digitize the sensed admittance characteristic and the sensed current draw characteristic.

13. The apparatus of claim 12 wherein the circuit further comprises a digital signal processor (DSP) configured to process digitized admittance and the digitized current draw and compute a plurality of admittance characteristic measurements and a plurality of current draw characteristic measurements.

14. The apparatus of claim 13 wherein the circuit further comprises a processor configured to (1) receive the computed admittance characteristic measurements and the computed current draw characteristic measurements from the DSP, (2) calibrate the alarm limit based on a plurality of the computed admittance characteristic measurements and a plurality of the computed current draw characteristic measurements, and (3) compare another plurality of the computed admittance characteristic measurements and another plurality of the computed current draw characteristic measurements with the customized alarm limit to determine whether the alarm condition exists.

15. The apparatus of claim 1 wherein the circuit is further configured to (1) categorize between a plurality of different types of electrical appliances as part of the calibration, and (2) customize the alarm limit based on the categorized electrical appliance type.

16. The apparatus of claim 15 wherein the electrical appliance types include a cabled electrical appliance having an active standby mode when the electrical appliance is turned off.

17. The apparatus of claim 16 wherein the electrical appliance types further include a first power brick type.

18. The apparatus of claim 17 wherein the electrical appliance types further include a second power brick type.

19. The apparatus of claim 16 wherein the electrical appliance types include a cabled electrical appliance that does not have an active standby mode when the electrical appliance is turned off.

20. The apparatus of claim 1 wherein the socket comprises a plurality of the sockets, each socket connected to the circuit.

21. The apparatus of claim 20 wherein the circuit is further configured to perform the calibrate operations on a per-socket basis such that alarm limits for the sockets are independently customized based on the electrical appliances connected to the sockets.

22. The apparatus of claim 1 wherein the circuit comprises a digital signal processor (DSP) configured to process data representative of the monitored electrical characteristics.

23. The apparatus of claim 1 wherein the circuit is further configured to (1) receive AC power from a power source, and (2) provide AC power to the connected electrical appliance through the socket.

24. The apparatus of claim 1 wherein the socket and the circuit are part of a power strip.

25. The apparatus of claim 24 wherein the power strip comprises a plurality of the sockets connected to the circuit.

26. The apparatus of claim 1 wherein the socket and the circuit are part of a wall outlet.

27. The apparatus of claim 1 wherein the socket comprises a USB-A socket, a USB-C socket, an RJ-45 socket, or a power over Ethernet (PoE) socket.

28. The apparatus of claim 1 wherein the circuit is configured to differentially measure the admittance characteristic through the socket to provide noise reduction with respect to the measured admittance characteristic.

29. The apparatus of claim 1 wherein the circuit is further configured to generate a pseudo noise (PN) sequence for spreading a spectrum of stimulation signals that are applied by the circuit to the socket to support the measured admittance characteristic and the measured current draw characteristic.

30. A method comprising:
distinguishing between a socket connected to an electrical appliance via a power brick and a socket connected to an electrical appliance via a cable based on a plurality of admittance characteristic measurements and a plurality of current draw characteristic measurements through the socket over a plurality of calibration phases; and
calibrating an alarm limit for the socket based on the distinguishing step.

* * * * *